US008116088B2

(12) United States Patent
Shin et al.

(10) Patent No.: US 8,116,088 B2
(45) Date of Patent: Feb. 14, 2012

(54) SEMICONDUCTOR PACKAGE AND METHOD OF FORMING THE SAME, AND PRINTED CIRCUIT BOARD

(75) Inventors: Mu-Seob Shin, Chungcheongnam-do (KR); Min-Young Son, Chungcheongnam-do (KR); Tae-Sung Yoon, Chungcheongnam-do (KR); Young-Hee Song, Gyeonggi-do (KR); Byung-Seo Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 951 days.

(21) Appl. No.: 12/116,123

(22) Filed: May 6, 2008

(65) Prior Publication Data

US 2008/0278921 A1    Nov. 13, 2008

(30) Foreign Application Priority Data

May 9, 2007    (KR) .................. 10-2007-0045012

(51) Int. Cl.
 H05K 1/11    (2006.01)
 H05K 3/34    (2006.01)
 H01L 23/02   (2006.01)
 H01L 23/48   (2006.01)

(52) U.S. Cl. ........ 361/760; 361/761; 257/678; 257/686; 257/738; 174/260; 174/266

(58) Field of Classification Search .................. None
See application file for complete search history.

(56) References Cited

U.S. PATENT DOCUMENTS

| | | | | |
|---|---|---|---|---|
| 5,384,689 A * | 1/1995 | Shen ............................. | 361/761 |
| 6,301,122 B1 * | 10/2001 | Ishikawa et al. ............. | 361/794 |
| 6,389,689 B2 * | 5/2002 | Heo ............................... | 29/840 |
| 6,861,737 B1 * | 3/2005 | Jeong et al. ................... | 257/680 |
| 7,291,925 B2 * | 11/2007 | Han et al. ...................... | 257/777 |
| 7,436,074 B2 * | 10/2008 | Pan et al. ....................... | 257/783 |
| 7,592,709 B2 * | 9/2009 | Chung et al. .................. | 257/784 |
| 7,649,248 B2 * | 1/2010 | Baek ............................. | 257/686 |
| 2001/0042916 A1 | 11/2001 | Kimura | |
| 2002/0079578 A1 * | 6/2002 | Matsuura ...................... | 257/738 |
| 2010/0314755 A1 * | 12/2010 | Kang et al. .................... | 257/737 |

FOREIGN PATENT DOCUMENTS

| | | |
|---|---|---|
| JP | 2002-026179 | 1/2002 |
| KR | 2002-0003512 | 1/2002 |
| KR | 2006-0036126 | 4/2006 |
| KR | 2006-0133804 | 12/2006 |

* cited by examiner

*Primary Examiner* — Boris Chervinsky
(74) *Attorney, Agent, or Firm* — Myers Bigel Sibley & Sajovec, P.A.

(57) ABSTRACT

Provided are a semiconductor package, a method of forming the semiconductor package, and a printed circuit board (PCB). The semiconductor package includes: a PCB including at least two parts divided by an isolation region; a semiconductor chip mounted on the PCB; and a molding layer disposed in the isolation region. The method includes: preparing a PCB, the PCB including a plurality of chip regions and a scribe region; forming isolation regions dividing each of the chip regions into two parts, the isolation regions including inner isolation regions and outer isolation regions, the inner isolation regions being provided in the chip regions, the outer isolation regions being provided at both ends of the inner isolation regions so as to extend toward the scribe region; mounting semiconductor chips on the chip regions; and cutting the PCB along the scribe region to divide the chip regions into at least two parts.

14 Claims, 32 Drawing Sheets

SEMICONDUCTOR PACKAGE AND METHOD OF FORMING THE SAME, AND PRINTED CIRCUIT BOARD

CROSS-REFERENCE TO RELATED APPLICATIONS

This U.S. non-provisional patent application claims priority under 35 U.S.C. §119 to Korean Patent Application No. 10-2007-0045012, filed on May 9, 2007, the entire contents of which are hereby incorporated by reference.

BACKGROUND

1. Technical Field

The present invention disclosed herein relates to a semiconductor device, a method of forming the same, and a printed circuit board (PCB). More particularly, the present invention relates to a semiconductor package, a method of forming the same, and a PCB.

2. Description of the Related Art

Packaging techniques for integrated circuit devices continue to be the subject of research and development in the semiconductor industry in order to satisfy demand for smaller and more reliable devices. Among the packaging techniques, one of the recently developed packages is a ball grid array (BGA) package. The BGA package uses a PCB instead of a typical lead frame. Since the PCB includes solder balls on the entire surface opposite to the surface where a semiconductor chip is attached, the BGA package may be advantageous for high mounting density. Additionally, because the BGA package is electrically connected to an external circuit through solder balls, an electrical signal transmission path can be minimized.

A molding layer of the BGA package may include an epoxy molding compound (EMC). While forming the molding layer, undesirable sweeping of wires often occurs. Additionally, the molding layer includes an upper molding layer covering the semiconductor chip and a lower molding layer covering the wires. Because the contact area between the upper molding layer and the lower molding layer becomes smaller, the BGA package may be easily delaminated.

The present invention addresses these and other disadvantages of the conventional art.

SUMMARY

Some embodiments of the present invention provides a semiconductor package reducing defects due to delamination of a semiconductor chip and a lower molding layer, and a method of forming the same. Some embodiments of the present invention also provide a printed circuit board (PCB) preventing defects due to delamination of a semiconductor chip and a lower molding layer. Some embodiments of the present invention further provides a stacked semiconductor package preventing defects due to delamination of a semiconductor chip and a lower molding layer.

Some embodiments of the present invention provide semiconductor packages including: a PCB having at least two parts divided by an isolation region; a semiconductor chip mounted on the PCB; and a molding layer disposed in the isolation region.

According to some embodiments, the isolation region includes an inner isolation region and two outer isolation regions, the two outer isolation regions being provided at both ends of the inner isolation region, and at least one width of the outer isolation regions is wider than a width of the inner isolation region.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
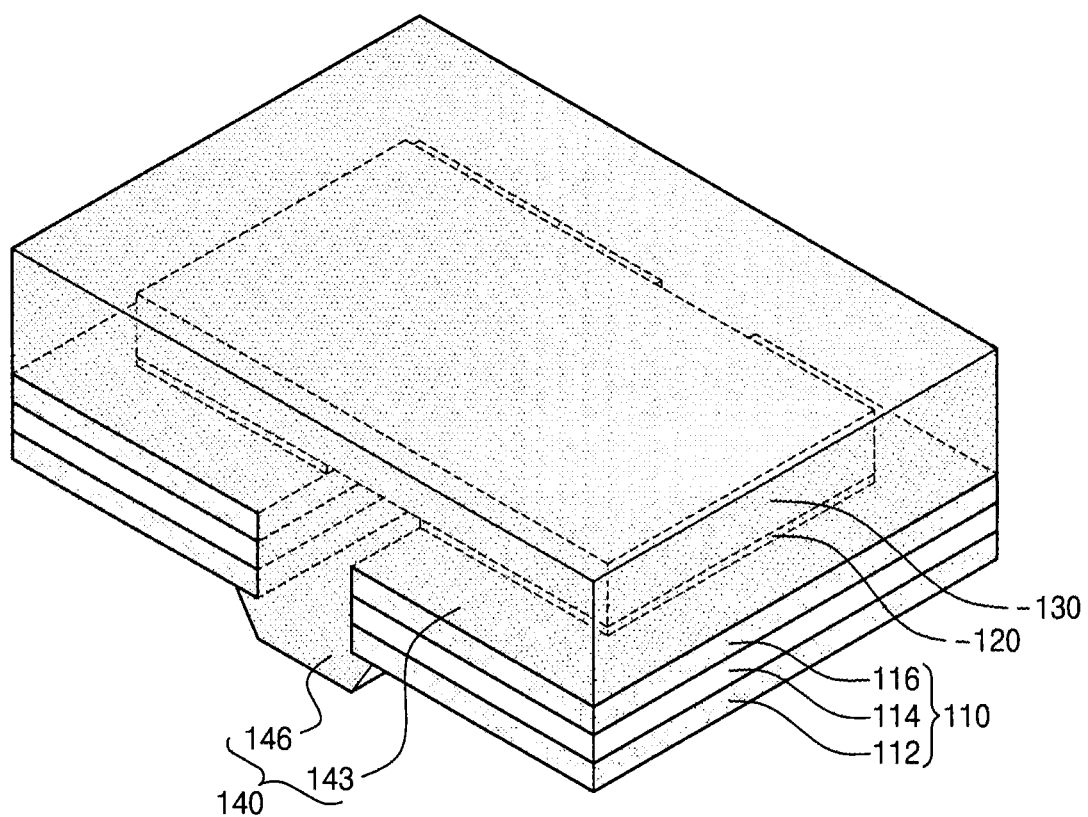
FIGS. 1 through 7 are views of a semiconductor package according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2:
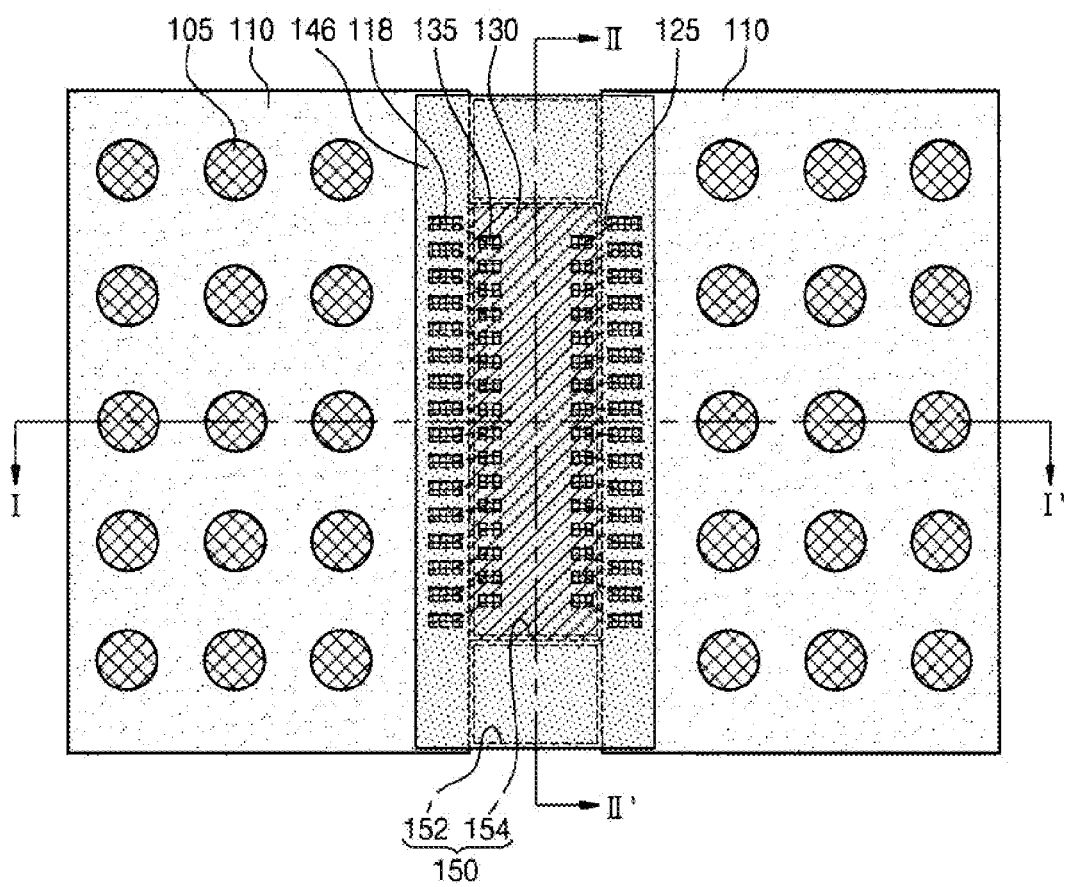
Figure 3:
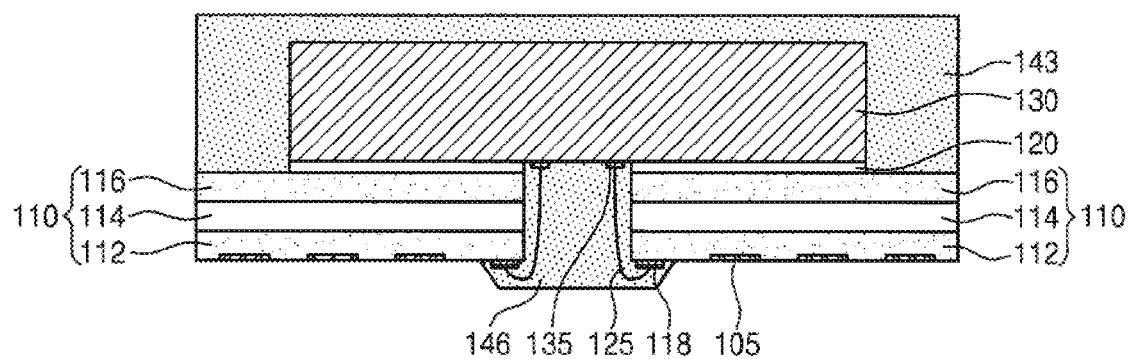
Figure 4:
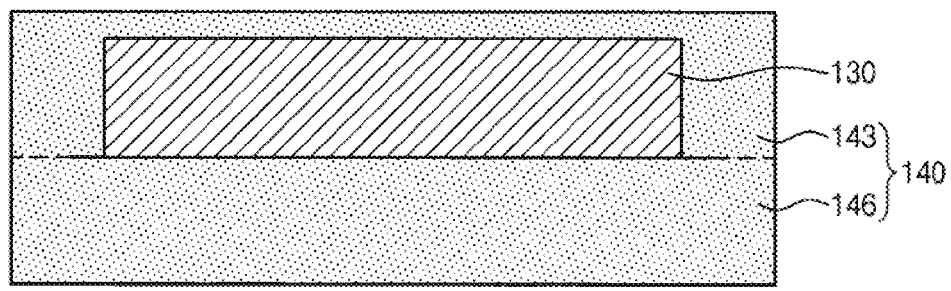

FIGS. 1 through 7 are views of a semiconductor package according to an embodiment of the present invention. FIG. 1 is a perspective view of a semiconductor package according to an embodiment of the present invention. FIG. 2 is a view of the bottom surface of the semiconductor package of FIG. 1. FIG. 3 is a sectional view taken along a line I-I' of FIG. 2. FIG. 4 is a sectional view taken along a line II-II' of FIG. 2.

Referring to FIGS. 1 through 4, there is provided a printed circuit board (PCB) 110 including two parts divided by an isolation region 150. The isolation region 150 includes an opening penetrating the PCB 110. The opening may be disposed at a central portion of the PCB 110. The PCB 110 includes a bottom insulation layer 112, a core material layer 114, and an upper insulation layer 116. The lower insulation layer 112 and the upper insulation layer 116 may include photo solder resist (PSR). Ball lands 105 are disposed on the lower insulation layer 112. A solder ball (not shown) may be attached to the ball land 105. The solder ball connects an external circuit with the PCB 110.

A semiconductor chip 130 is mounted on the PCB 110. The semiconductor chip 130 may be attached to the PCB 110 by an adhesive layer 120. The isolation region 150 includes inner isolation region 154 and two outer isolation regions 152 at both ends of the inner isolation region 154. The two outer isolation regions 152 may facilitate supply of a molding compound during formation of a molding layer, which will be described below. The semiconductor chip 130 includes bonding pads 135 at its center, and the PCB 110 may include bond fingers 118 adjacent to the inner isolation region 154. There are provided wires 125 connecting the bonding pads 135 with the bond fingers 118.

A molding layer 140 is disposed on the isolation area 150. The molding layer 140 may include an epoxy molding compound (EMC). The molding layer 140 includes a lower molding layer 146 and an upper molding layer 143. The lower molding layer 146 extends from the isolation area 150 to cover the bond fingers 118 and the wires 125. The upper molding layer 143 covers the semiconductor chip 130. The opening penetrating the PCB 110 can be located at the outer isolation areas 152. Accordingly, the upper molding layer 143 can contact the lower molding layer 146 at the outer isolation areas 152 through the opening.

According to an embodiment of the present invention, the outer isolation regions 152 may provide a sufficiently spacious contact area between the upper molding layer 143 and the lower molding layer 146. Accordingly, delamination between the semiconductor chip 130 and the lower molding layer 146 can be suppressed. The outer isolation regions 152 may alleviate the pressure of the EMC so that sweeping of the wires 125 (especially adjacent to the outer isolation regions 152) or shorts of the wires 125 can be prevented. Accordingly, reliability of the semiconductor package is improved, and also a demand for miniaturization of the semiconductor package can be satisfied.

Figure 5:
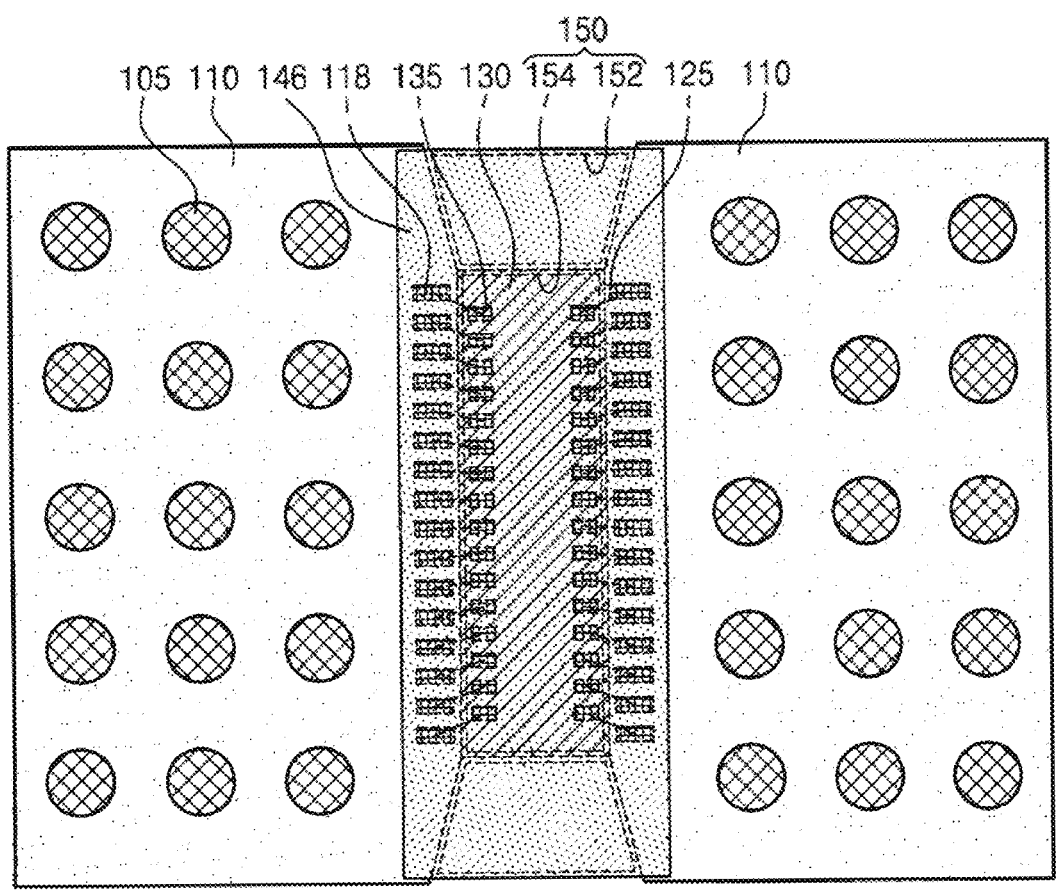
Figure 6:
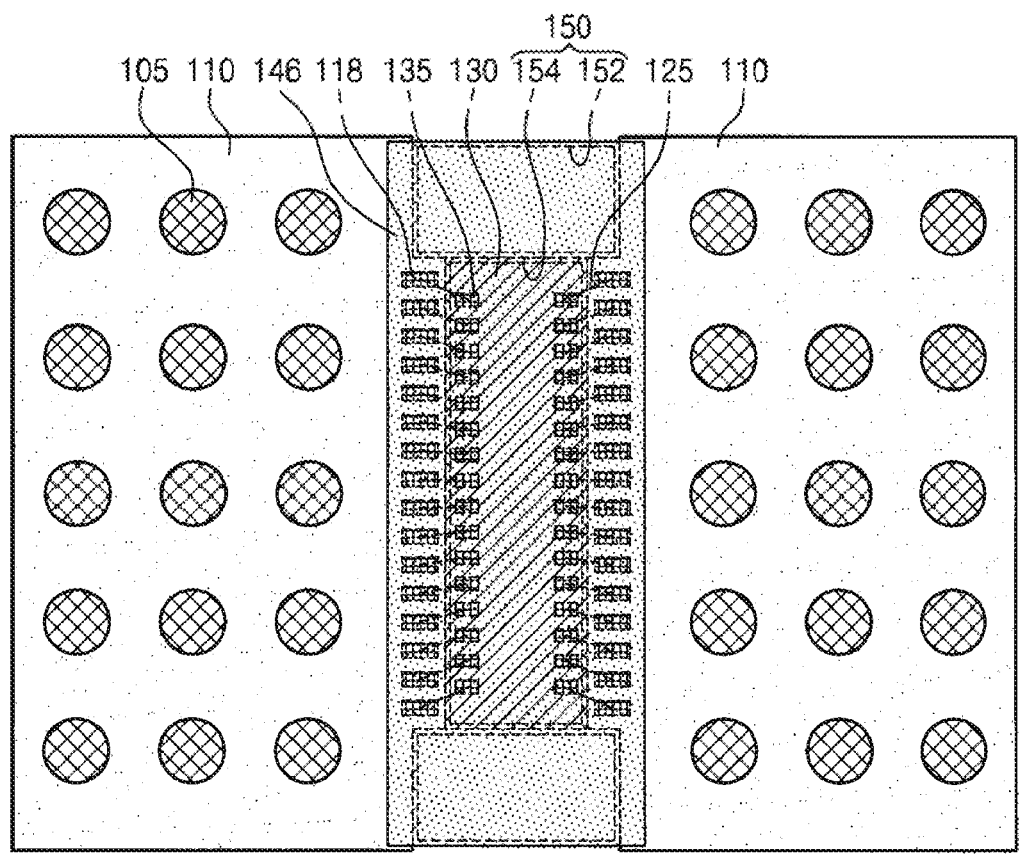

Referring to FIGS. 5 and 6, at least one width of the outer isolation regions 152 can be wider than the width of the inner isolation region 154. The outer isolation region 152 may facilitate supply of the molding compound during formation of the molding layer 140. The PCB 110 divided by the isolation region 150 may be a polygon with at least five sides. One of the sides of the polygon may facilitate supply of the molding compound during formation of the molding layer 140. The width of the lower molding layer 146 may be broader than the width of the outer isolation regions 152. That is, when the widths of the outer isolation regions 152 are expanded, delamination of the semiconductor package and the sweeping of the wires 125 can be prevented.

In more detail, referring to FIG. 5, the width of the outer isolation regions 152 may become narrower as it approaches the edge of the PCB 110 into the inner isolation region 154. In FIG. 5, the width of the outer isolation region 152 may be linearly reduced, but also may be reduced in various forms. Referring to FIG. 6, the width of the outer isolation regions 152 may be substantially uniform.

Figure 7:
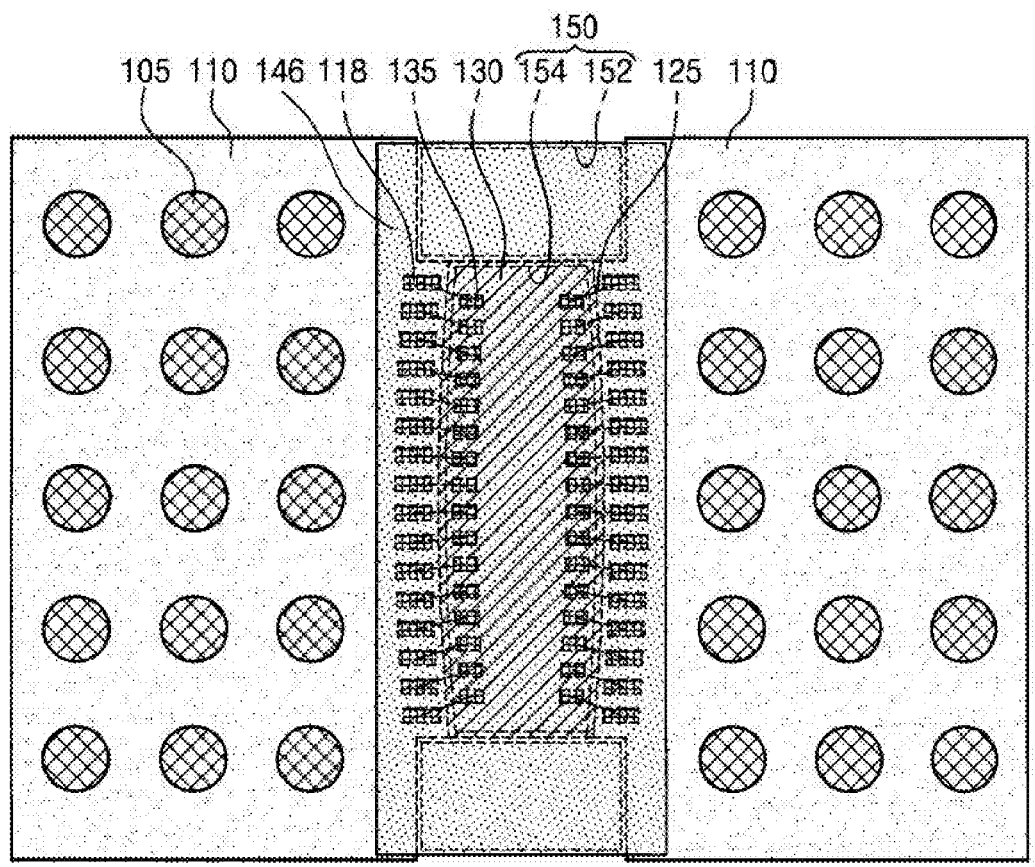

Referring to FIG. 7, at least one width of the outer isolation regions 152 may be wider than the width of the inner isolation region 154. The inner isolation region 154 may have a wider width at its center spaced apart from the outer isolation region 152 than the edge contacting the outer isolation region 152. Accordingly, an alignment margin between the bonding pads 135 and the bond fingers 118 can be sufficiently obtained. Similar to FIG. 6, the bonding pads 135 and the bond fingers 118 may be disposed in a row.

Figure 8:
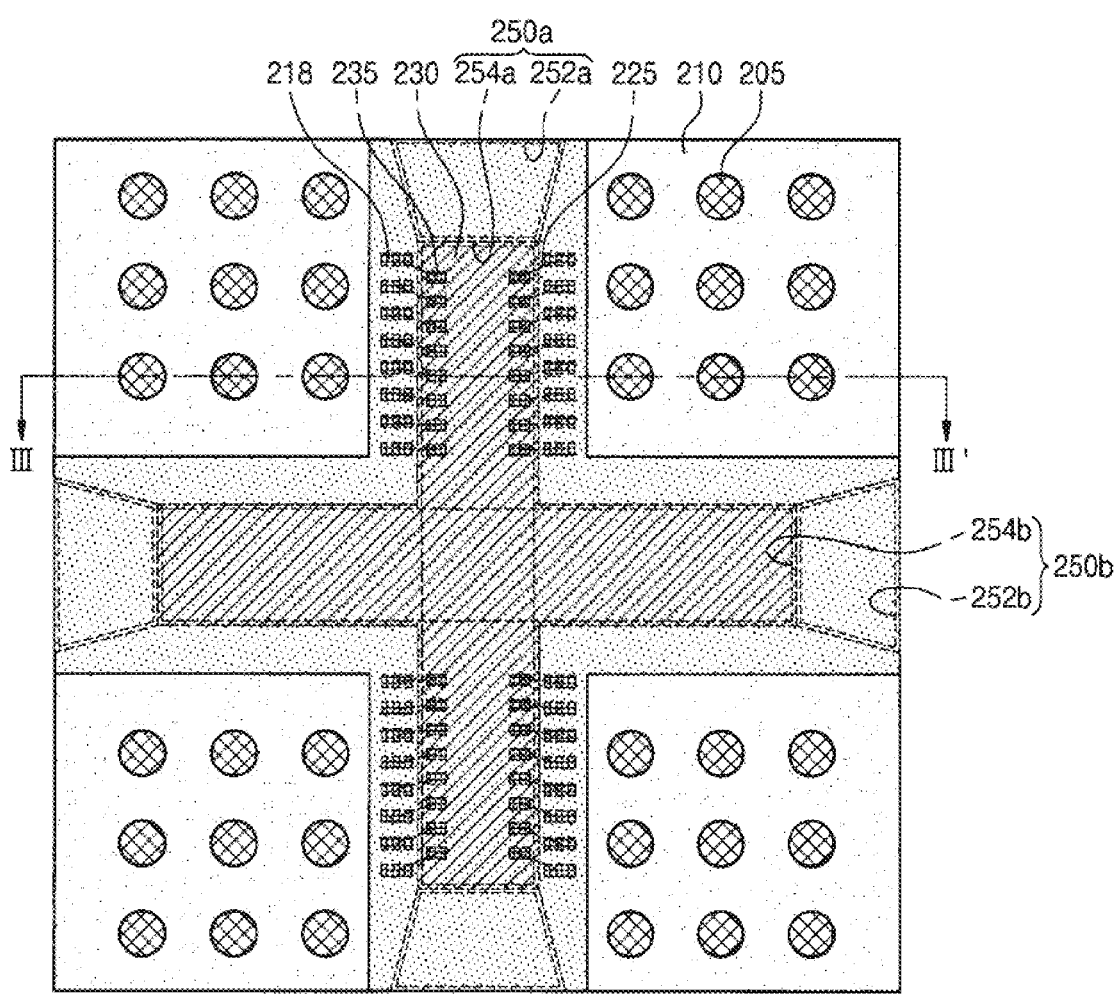
FIGS. 8 through 11 are views illustrating a semiconductor package according to another embodiment of the present invention.
Figure 9:
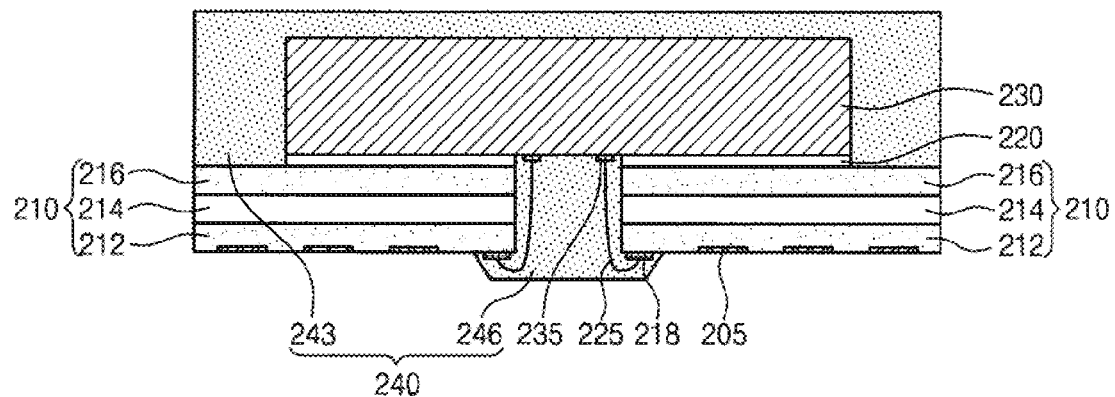

FIGS. 8 through 11 are views illustrating a semiconductor package according to another embodiment of the present invention. FIG. 9 is a sectional view taken along a line III-III' of FIG. 8.

Referring to FIGS. 8 and 9, there is provided a PCB 210 divided into four regions by a first isolation region 250a and a second isolation region 250b. A semiconductor chip 230 is mounted on the PCB 210. The semiconductor chip 230 may be attached to the PCB 210 by an adhesive layer 220. The first isolation region 250a crosses over the PCB 210 in one direction. The first isolation region 250a includes a first inner isolation region 254a and first outer isolation regions 252a at both ends of the first inner isolation region 254a. At least one width of the first outer isolation regions 252a may be wider than the width of the first inner isolation region 254a. In more detail, the width of the first outer isolation regions 252a may be tapered from the edge of the PCB 210 to the first inner isolation region 254a.

The second isolation region 250b may intersect with the first isolation region 250a. The second isolation region 250b includes a second inner isolation region 254b and second outer isolation regions 252b at both ends of the second inner isolation region 254b. At least one width of the second outer isolation regions 252b may be wider than the width of the second inner isolation region 254b. The first and second outer isolation regions 252a and 252b may facilitate supply of a molding compound during formation of a molding layer, which will be described below.

The PCB 210 may be a polygon with at least five sides. One of the sides of the polygon may facilitate supply of a molding compound during formation of a molding layer.

The PCB 210 includes a lower insulation layer 212, a core material layer 214, and an upper insulation layer 216. The lower insulation layer 212 and the upper insulation layer 216 may include photo solder resist (PSR). A ball land 205 is disposed on the lower insulation layer 212. A solder ball (not shown) may be attached to the ball land 205. The solder ball may connect an external circuit with the PCB 210.

The semiconductor chip 230 includes bonding pads 235 at its center, and the PCB 210 may include bond fingers 218 adjacent to the first inner isolation region 254a. There are provided wires 225 connecting the bonding pads 235 with the bonding fingers 218.

A molding layer 240 is disposed on the first and second isolation regions 250a and 250b. The molding layer 240 may include EMC. The molding layer 240 includes a lower molding layer 246 and an upper molding layer 243. The lower molding layer 246 extends from the first and second isolation regions 250a and 250b to cover the bond fingers 218 and the wires 225. The upper molding layer 243 covers the semiconductor chip 230. The upper molding layer 243 contacts the lower molding layer 246 at the first and second outer isolation regions 252a and 252b.

According to another embodiment of the present invention, because the first and second outer isolation regions 252a and 252b are provided, a sufficient contact area between the upper molding layer 243 and the lower molding layer 246 can be obtained. Accordingly, defects due to delamination of the semiconductor chip 230 and the lower molding layer 246 can be suppressed. Because a pressure of EMC is reduced, sweeping of wires 225 or shorts of the wires 225 can be prevented. Accordingly, reliability of the semiconductor package is improved, and a demand for miniaturization of the semiconductor package can be satisfied.

Figure 10:
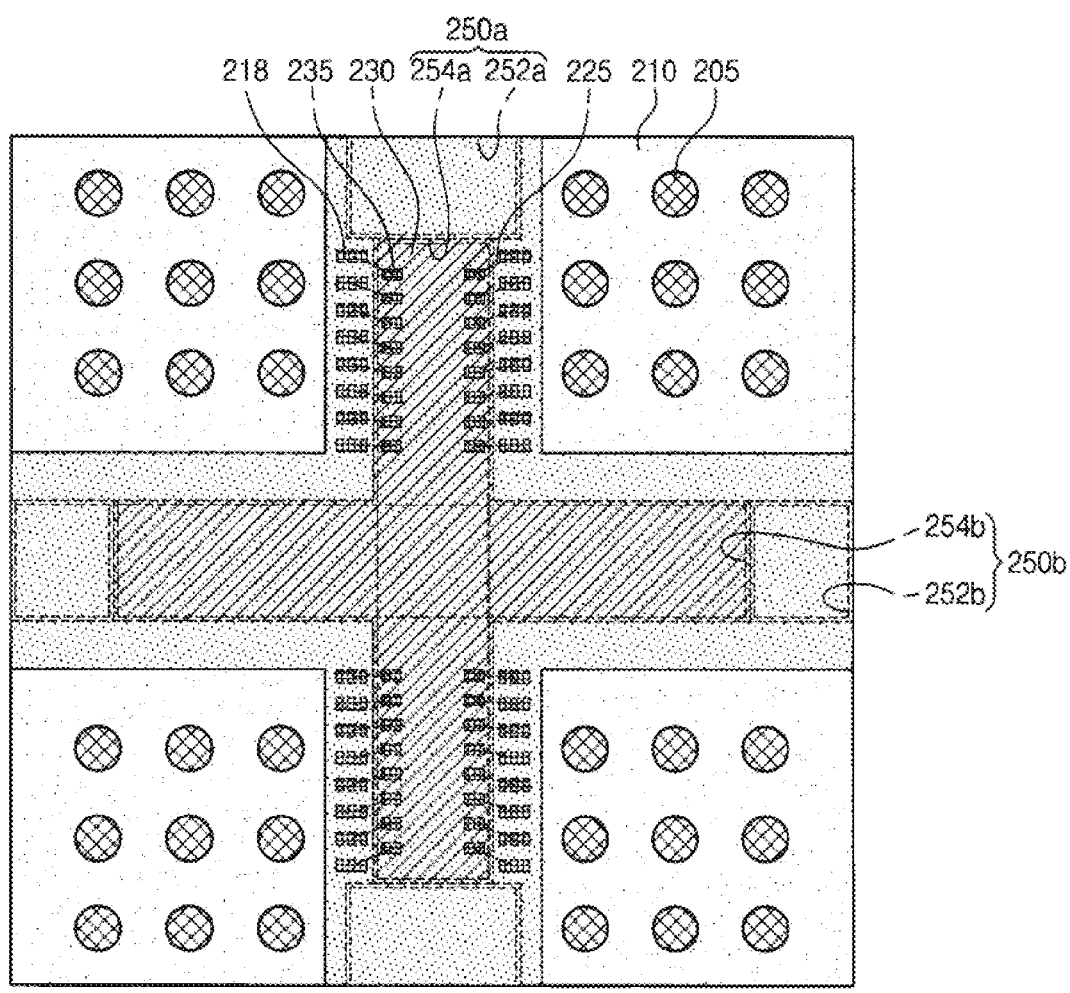

Referring to FIG. 10, the widths of the first outer isolation regions 252a may be wider than the width of the first inner isolation region 254a, and the widths of the second outer isolation regions 252b may be substantially equal to the width of the second inner isolation region 254b. The widths of the first outer isolation regions 252a may be substantially the same. The width of the lower molding layer 246 may be wider than the widths of the first and second outer isolation regions 252a and 252b. That is, when the widths of the first outer isolation regions 252a are extended, sweeping and shorts of the wires 225 can be prevented.

Figure 11:
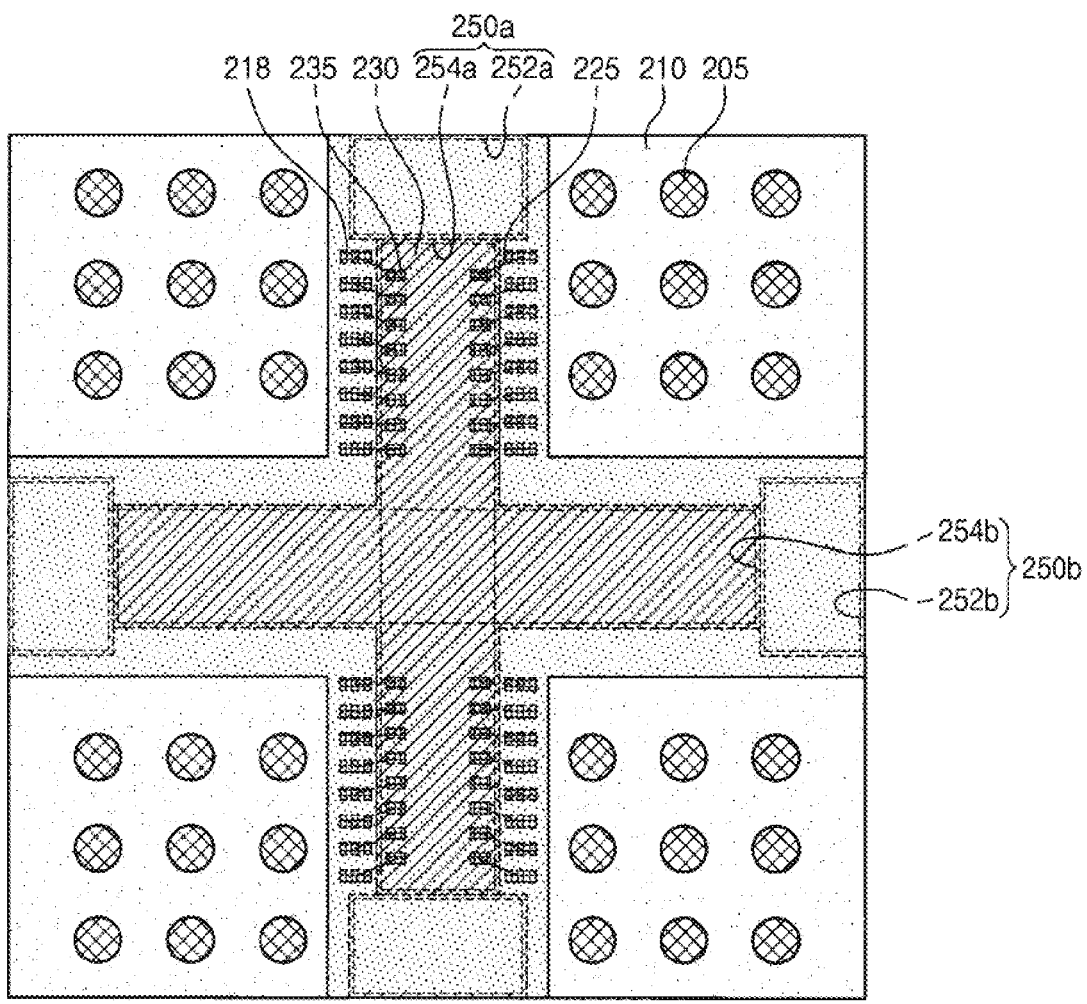

Referring to FIG. 11, the widths of the first and second outer isolation regions 252a and 252b may be wider than the widths of the first and second inner isolation regions 254a and 254b. The widths of the first and second outer isolation regions 252a and 252b may be substantially uniform. The width of the lower molding layer 246 may be wider than the widths of the first and second outer isolation regions 252a and 252b. Because the widths of the first and second outer isolation regions 252a and 252b are expanded, a sufficient contact area between the upper molding layer 243 and the lower molding layer 246 can be obtained. Accordingly, delamination of the semiconductor package can be prevented.

Figure 12:
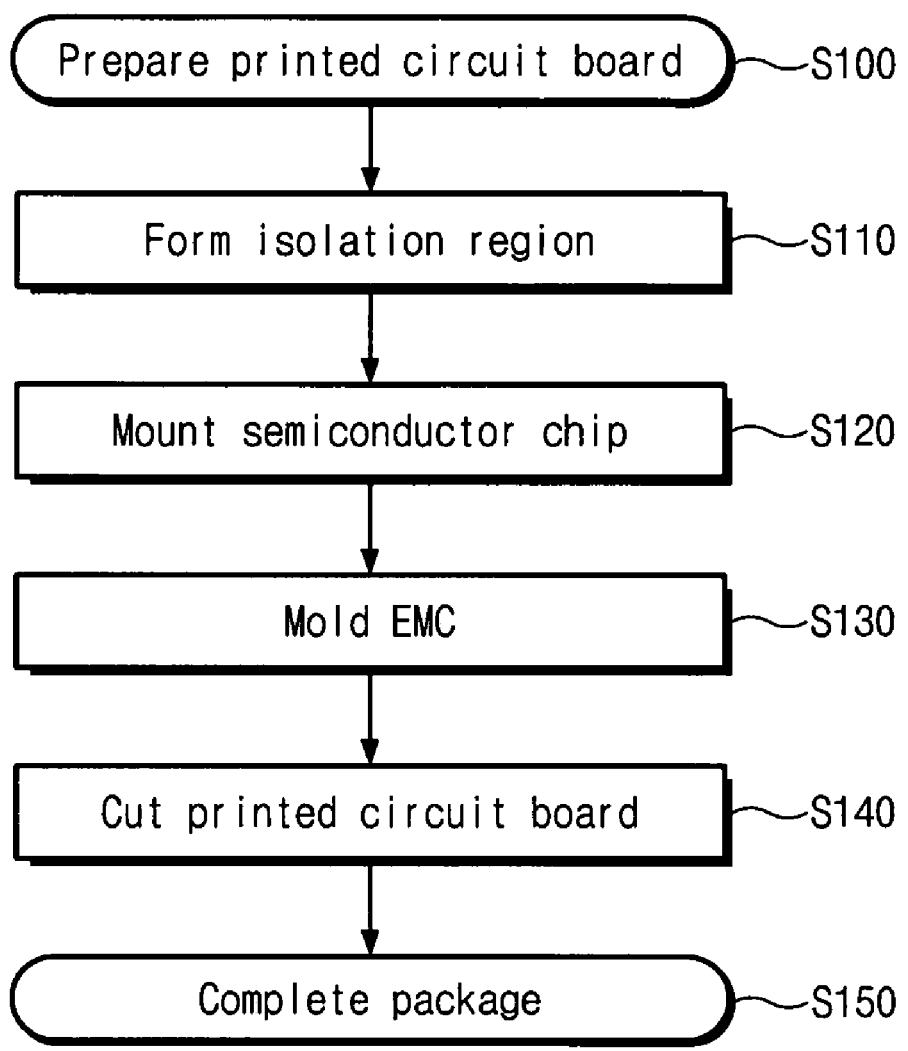
FIG. 12 is a flowchart illustrating a method of forming a semiconductor package according to an embodiment of the present invention.

FIG. 12 is a flowchart illustrating a method of forming a semiconductor package according to an embodiment of the present invention.

Referring to FIG. 12, the method of forming the semiconductor package includes preparing a PCB in operation S100, forming a device isolation region in operation S110, mounting a semiconductor chip in operation S120, molding EMC in operation S130, and cutting the PCB in operation S140.

Referring to FIGS. 13 through 19, the preparing of the PCB in operation S100 and the forming of the isolation region in operation S110 will be described according to an embodiment of the present invention.

Figure 13:
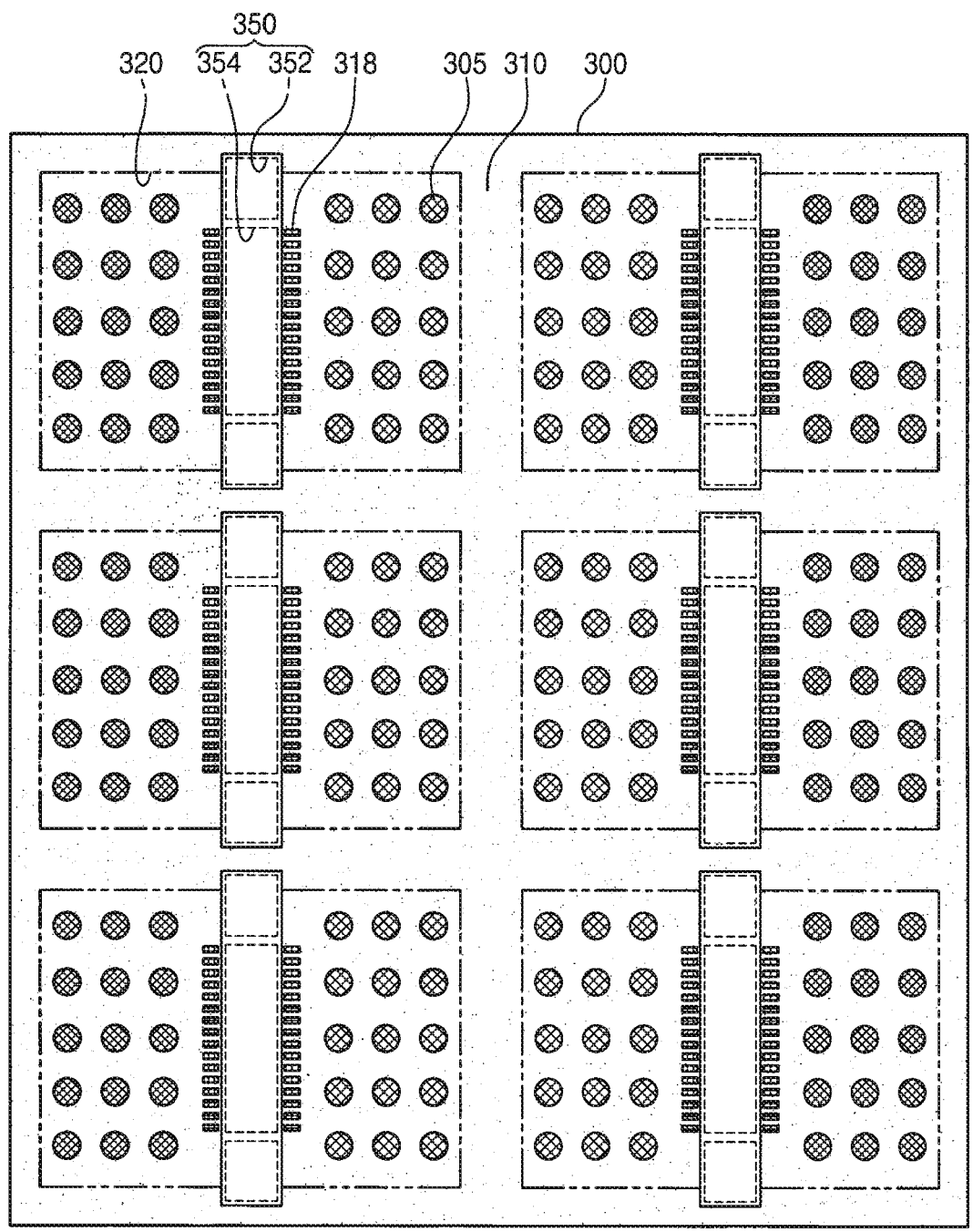
FIGS. 13 through 20 are views illustrating a method of forming a semiconductor package according to an embodiment of the present invention.

A PCB 300 including a plurality of chip regions 320 and a scribe region 310 is prepared. Referring to FIG. 13, isolation regions 350 are formed on the PCB 300 to divide the chip regions 320 into two parts. The isolation regions 350 include an inner isolation region 354 and two outer isolation regions 352. The inner isolation regions 354 are provided in the chip regions 320. The two outer isolation regions 352 are provided at both ends of the inner isolation regions 354 so as to extend toward the scribe region 310.

The adjacent outer isolation regions 352 may be spaced apart from each other, and the separation may be narrower than the width of the scribe region 310. Accordingly, the PCB 300 may be easily processed. Ball lands 305 are formed on the chip regions 320. Bond fingers 318 are formed adjacent to the inner isolation regions 354.

Figure 14:
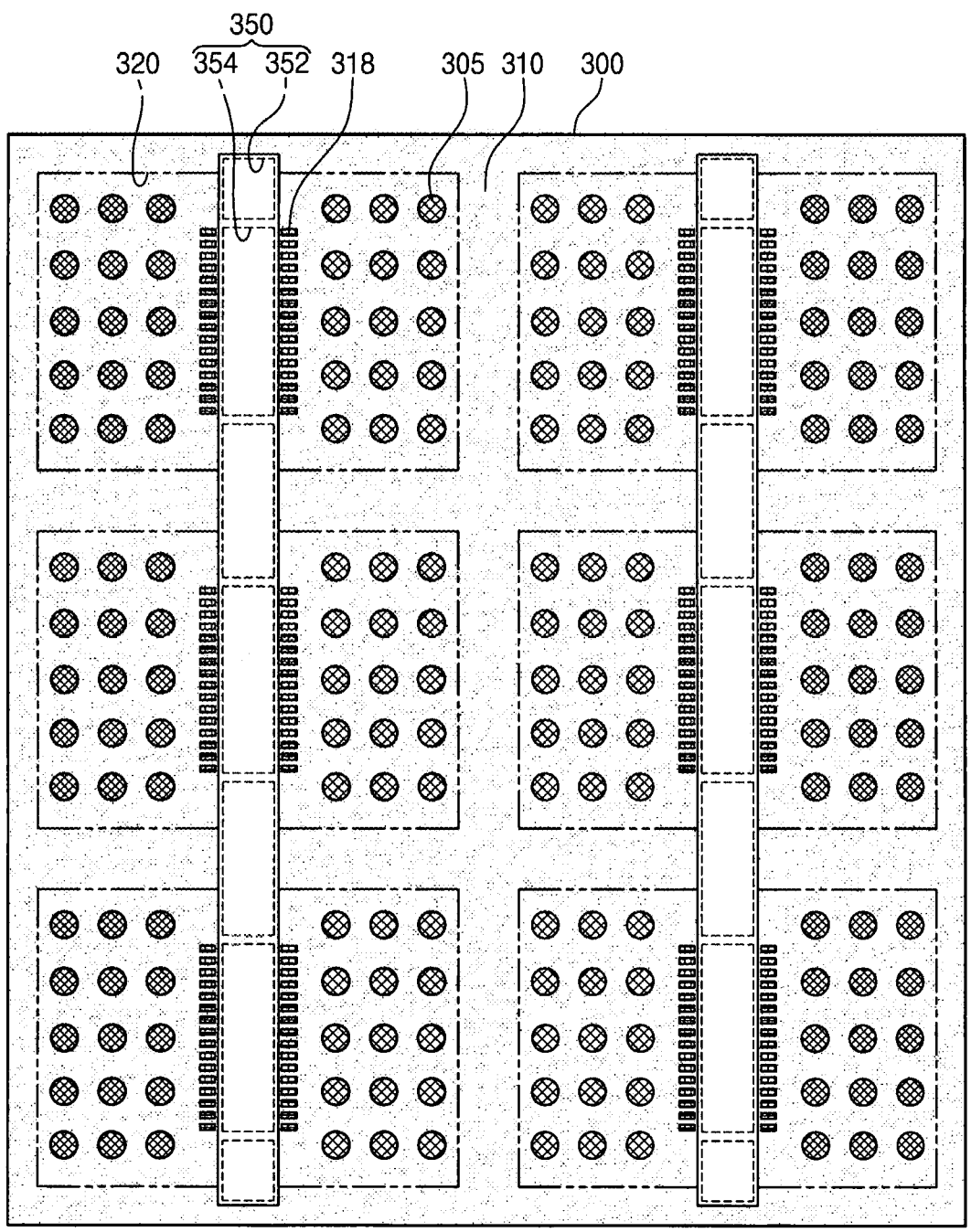

Referring to FIG. 14, the outer isolation regions 352 may be connected to each other at the scribe region 310. Because of the connected outer isolation regions 352, the forming of the isolation regions 350 may be done more easily.

Figure 15:
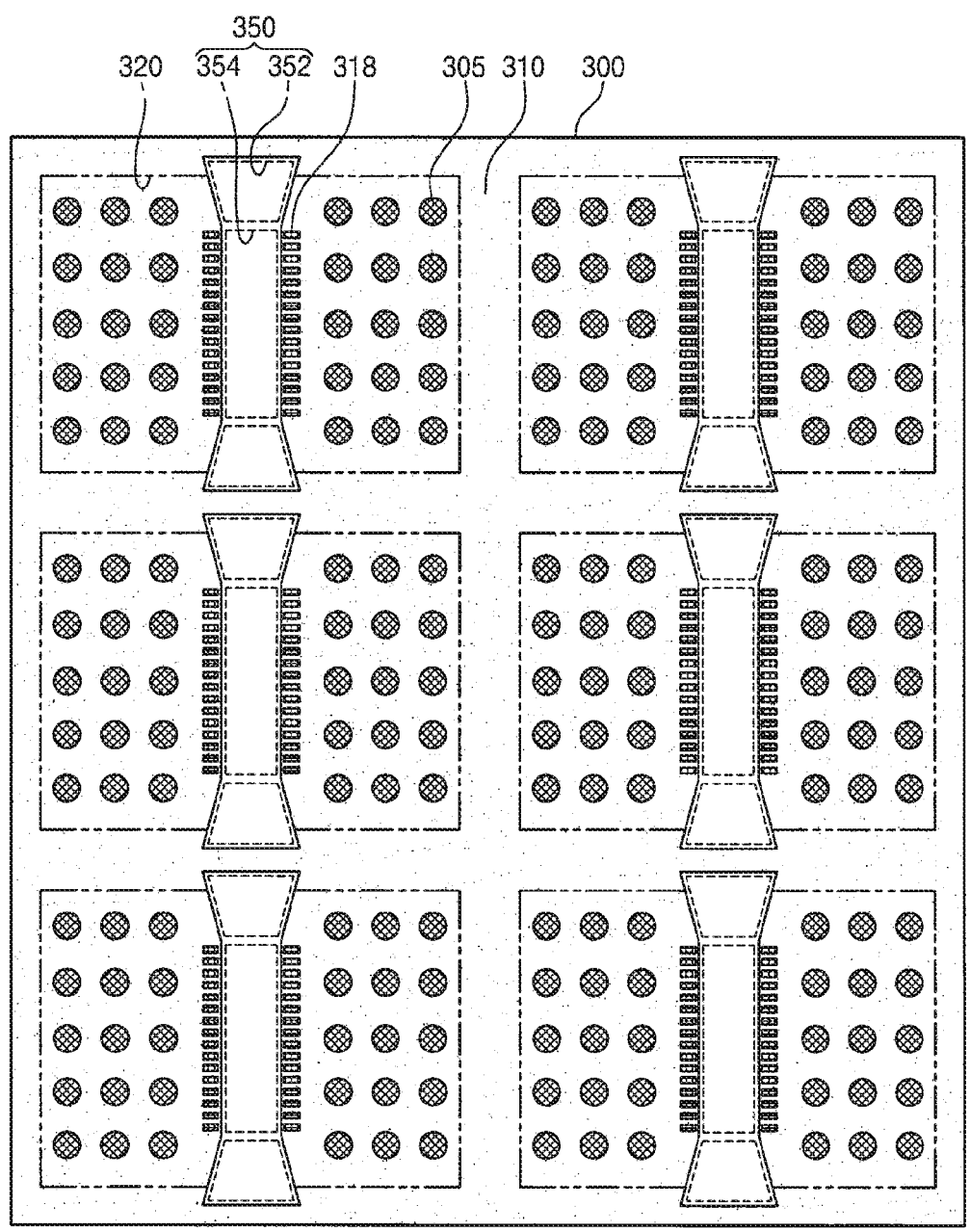

Referring to FIG. 15, the widths of the outer isolation regions 352 may be wider than the width of the inner isolation region 354. More specifically, the widths of the outer isolation regions 352 may be tapered from the scribe region 310 to the inner isolation regions 354. The adjacent outer isolation regions 354 may be spaced apart from each other, and the separation may be narrower than the width of the scribe region 310. Accordingly, the PCB 300 may be easily processed. Because the widths of the outer isolation regions 352 expand, a pressure of EMC can be reduced, which is further described below.

Figure 16:
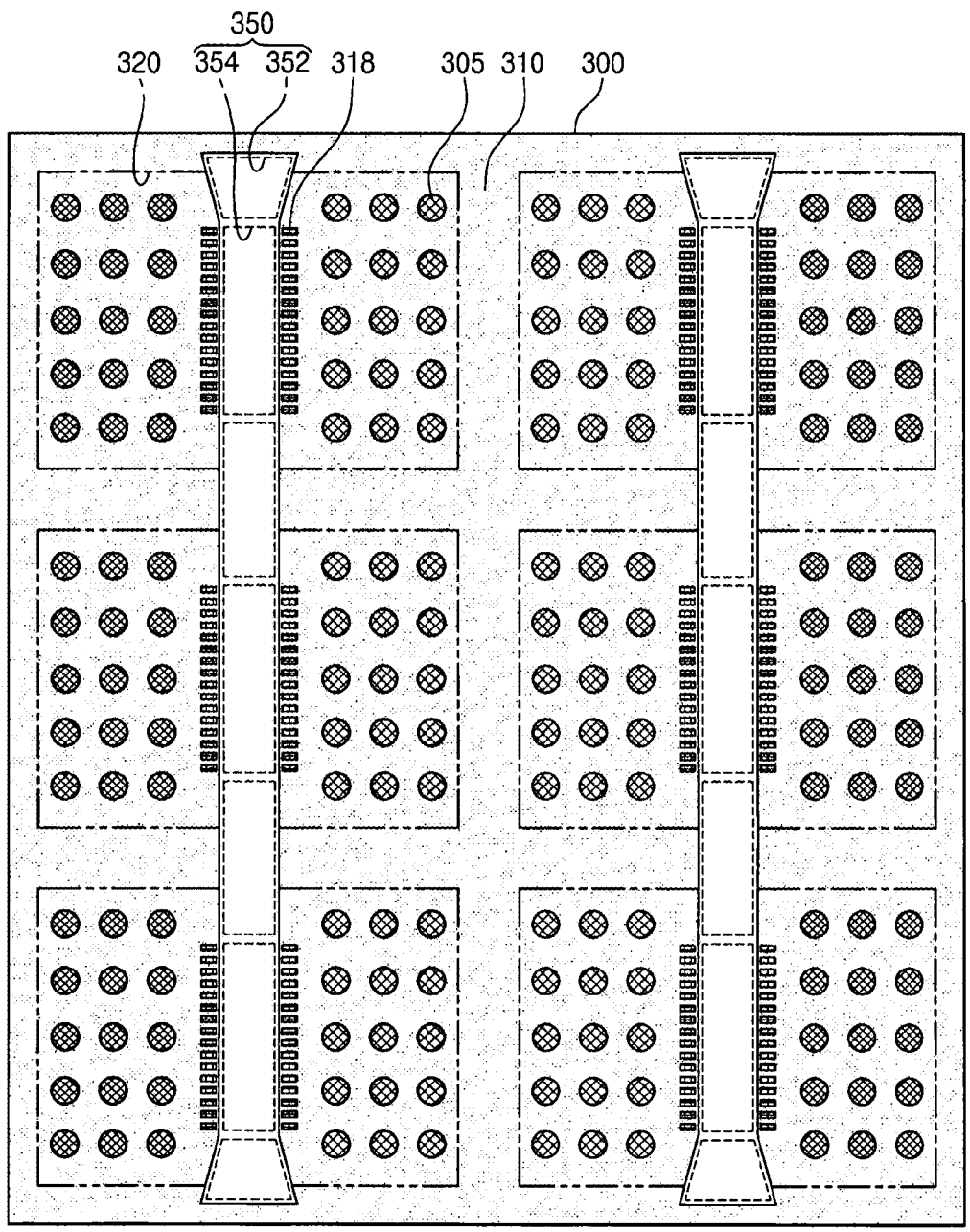

Referring to FIG. 16, the widths of the outer isolation regions 352 at the edge of the PCB 300 may be tapered from the scribe region 310 to the inner isolation regions 354. The outer isolation regions 352 are connected to each other at the scribe region 310. Because the outer isolation regions 352 are connected to each other, the forming of the isolation regions may be done more easily.

Figure 17:
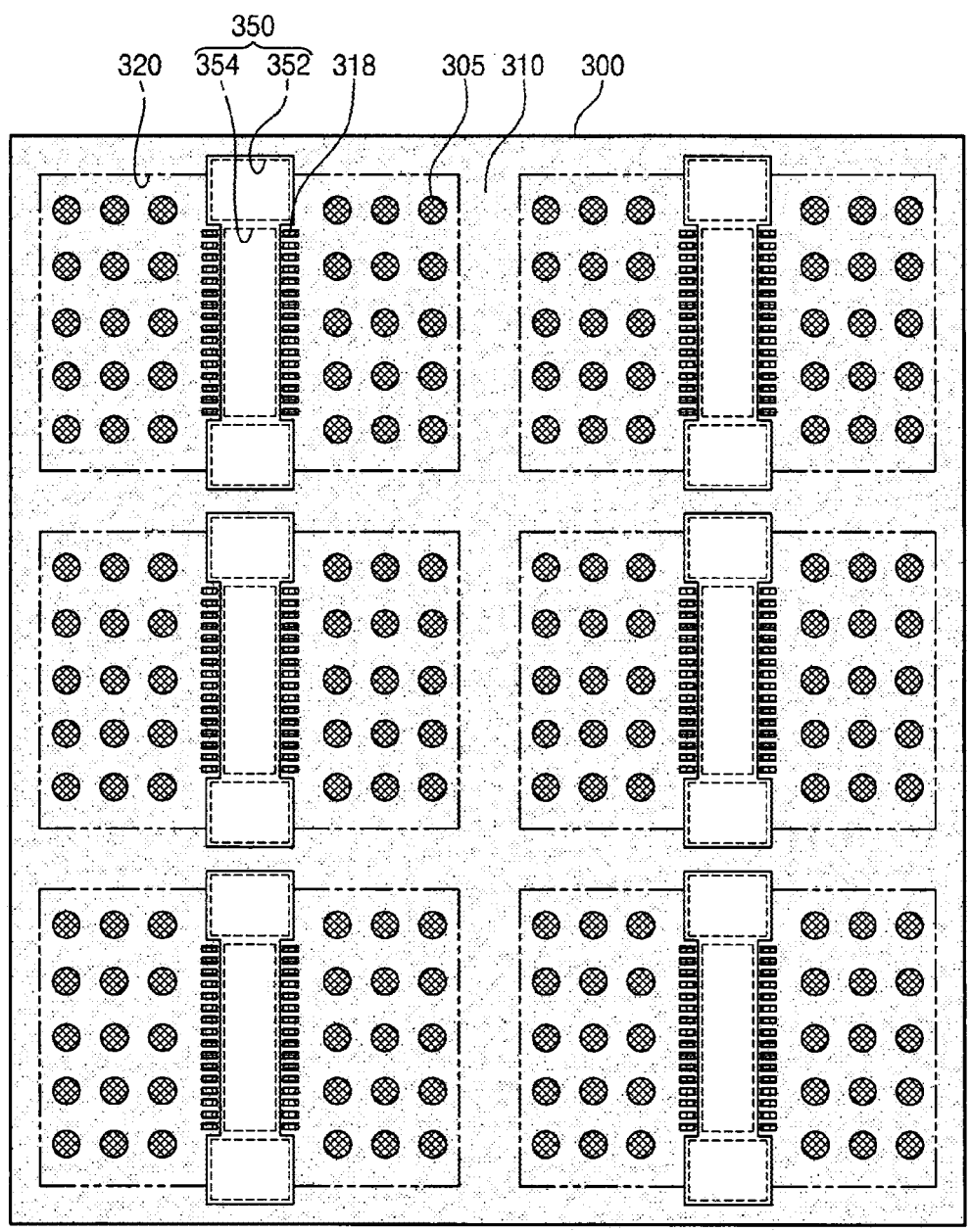

Referring to FIG. 17, the widths of the outer isolation regions 352 may be wider than the width of the inner isolation region 354. In more detail, the widths of the outer isolation regions 352 may be substantially uniform. The adjacent outer isolation regions 352 may be spaced apart from each other, and the separation may be narrower than the width of the scribe region 310. Accordingly, the PCB 300 can be easily handled.

Figure 18:
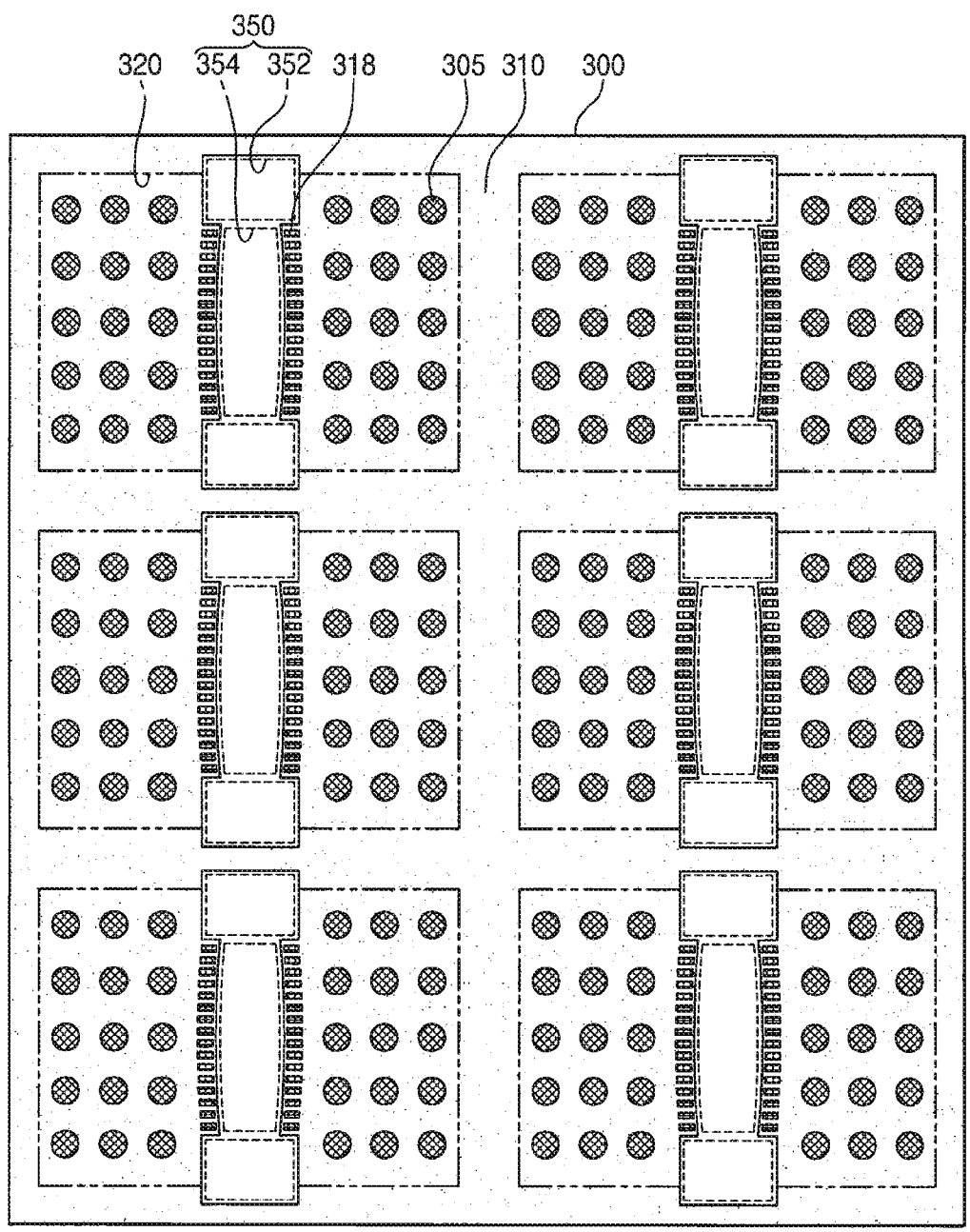

Referring to FIG. 18, the widths of the outer isolation regions 352 may be wider than the width of the inner isolation regions 354. More specifically, the outer isolation regions 352 may be substantially uniform. The inner isolation regions 354 may have a wider width at their centers spaced apart from the outer isolation regions 352 than at their edges contacting the outer isolation regions 352. Accordingly, an alignment margin of the bond fingers can be obtained.

Figure 19:
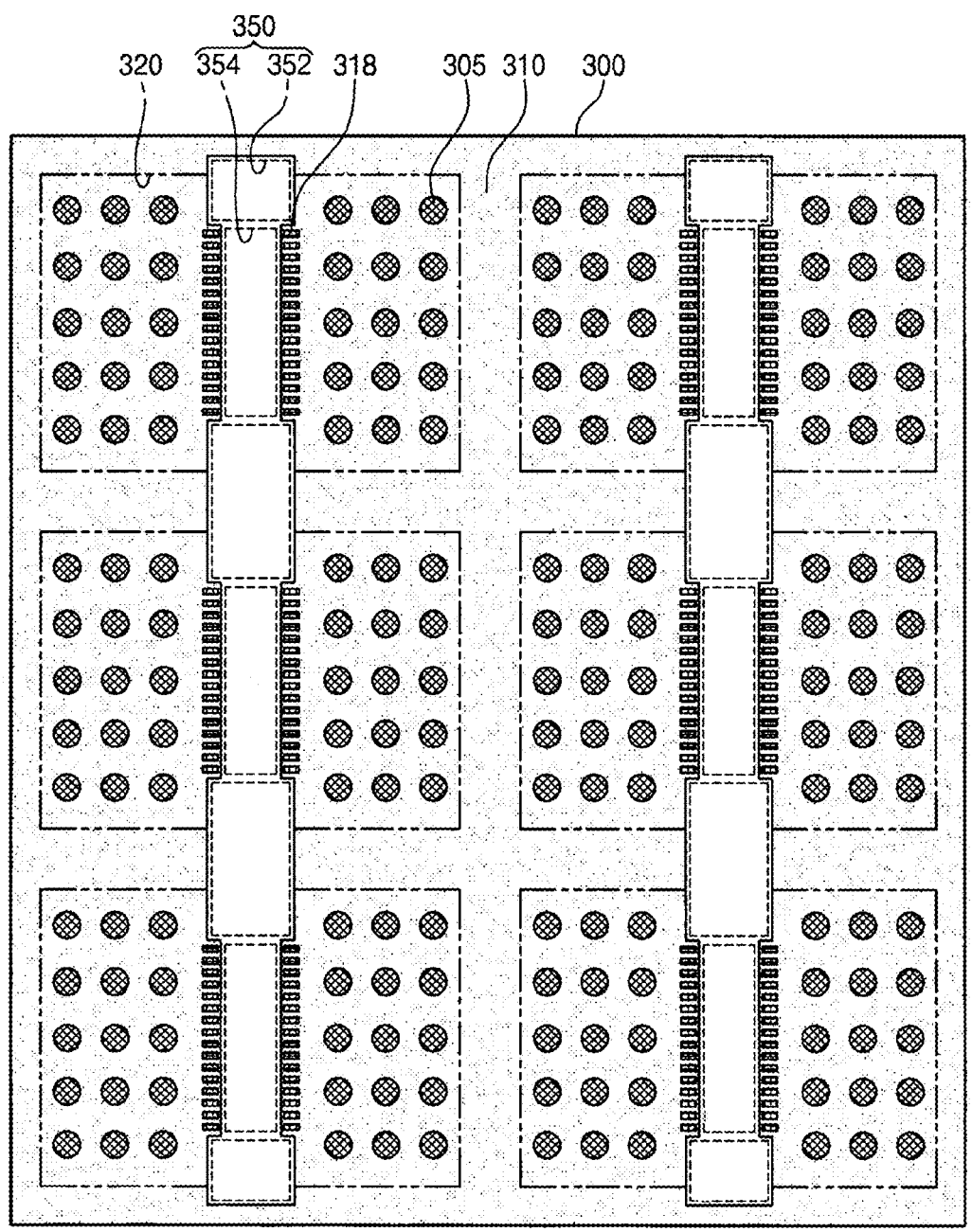

Referring to FIG. 19, the width of the outer isolation regions 352 may be wider than the width of the inner isolation regions 354. More specifically, the outer isolation regions 352 may be substantially uniform. The outer isolation regions 352 may be connected to each other at the scribe region 310, and thus the forming of the isolation regions 350 may be done more easily.

Figure 20:
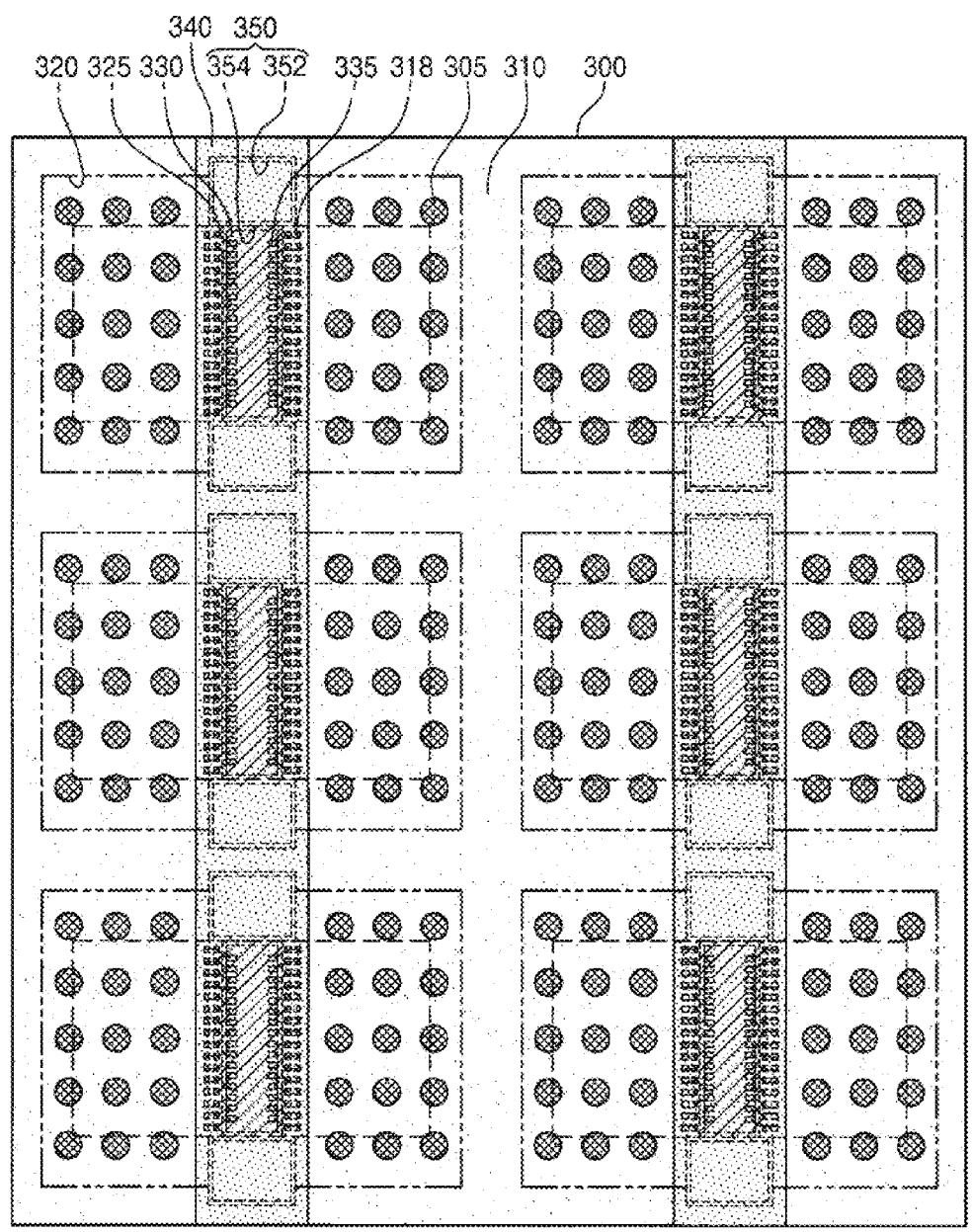

Referring to FIG. 20, the mounting of the semiconductor chip in operation S120 and the molding of EMC in operation S130 will be described. Referring to FIG. 20, semiconductor chips 330 are mounted on the chip regions 320 of the PCB 300 of FIG. 17. The semiconductor chips 330 may be mounted on the chip regions 320 by adhesive layers. The semiconductor chip 330 may be arranged and mounted on the inner isolation regions 354. The semiconductor chips 330 may have bonding pads 335 at theirs center. Wires 325 may be formed to electrically connect the bonding pads 335 with the bond fingers 318.

A molding layer 340 is formed on the isolation regions 350. The molding layer 340 may be formed of EMC. The molding layer 340 includes a lower molding layer and an upper molding layer. The lower molding layer extends from the isolation area 350 to cover the wires 325 and the upper molding layer covers the semiconductor chip 330. When forming the upper molding layer, EMC comes in through the outer isolation regions 352 in order to form the lower molding layer. The outer isolation regions 352 may facilitate supply of the EMC during formation of the molding layer 340.

After forming the molding layer 340, the PCB 300 may be cut along the scribe region 310 in operation S140. Accordingly, the chip region 320 may be formed, which is divided into two parts by the isolation region 350. The semiconductor package of FIG. 6 is completed in operation S150.

Because the outer isolation region 352 is sufficiently wide, a pressure of EMC can be reduced. Accordingly, because the semiconductor chips 330 and the lower molding layer 346 are not delaminated, sweeping and shorts of the wires 325 can be prevented. Additionally, the wires 325 may be formed adjacent to the outer isolation regions 352.

Referring to FIGS. 21 through 25, the preparing of the PCB in operation S100 and the forming of the isolation region in operation S110 will be described according to another embodiment of the present invention.

Figure 21:
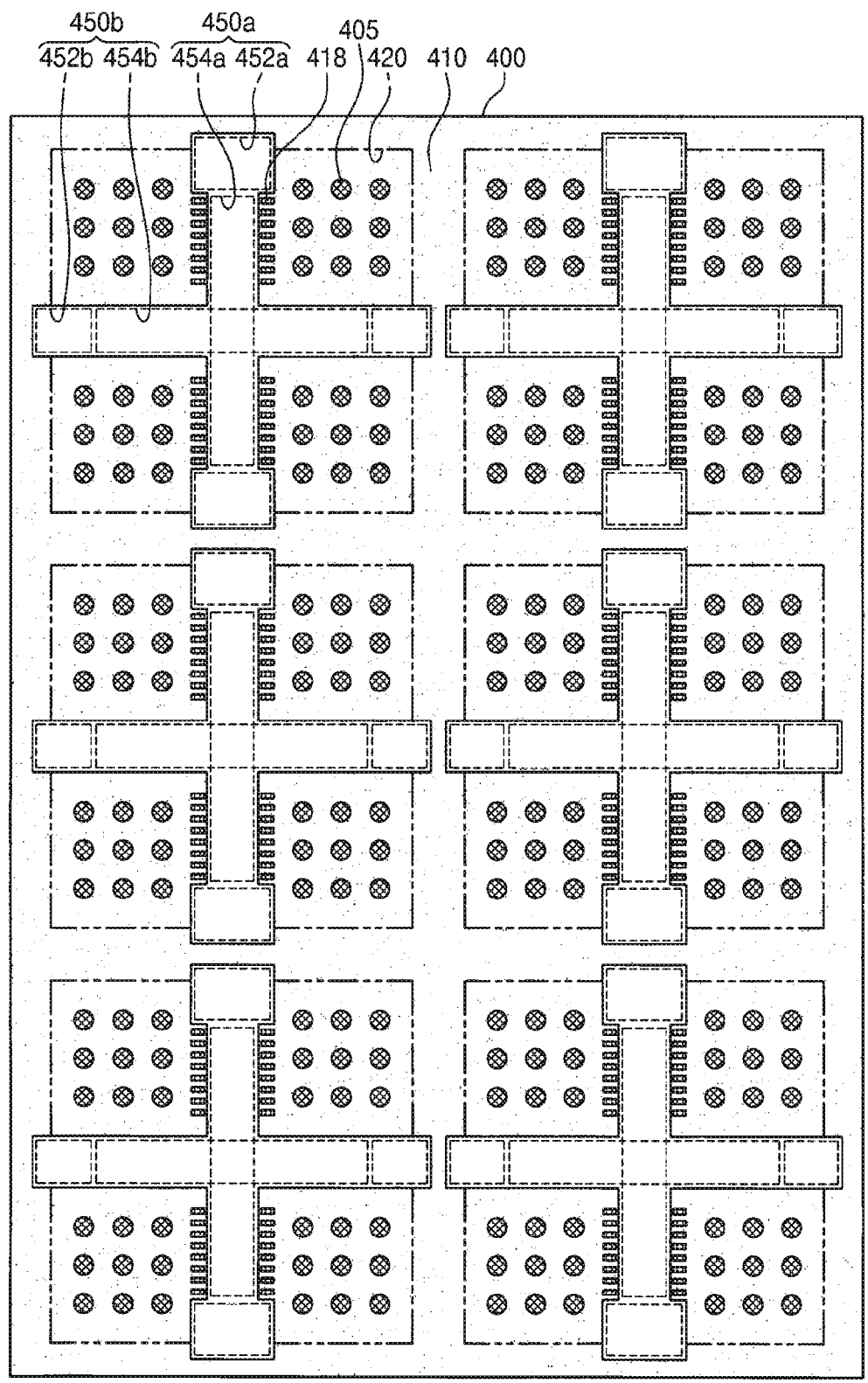
FIGS. 21 through 25 are views illustrating a method of forming a semiconductor package according to another embodiment of the present invention.

Referring to FIG. 21, there is prepared a PCB 400 including a plurality of chip regions 420 and a scribe region 410. First and second isolation regions 450a and 450b are formed on the PCB 400 to divide the chip regions 420 into four parts. The first isolation regions 450a include first inner isolation regions 454a and first outer isolation regions 452a. The first inner isolation regions 454a are provided in the chip regions 454a. The first outer isolation regions 452a are provided at both ends of the first inner isolation regions 454a so as to extend toward the scribe region 410. The width of the first outer isolation region 452a may be wider than the widths of the first inner isolation regions 454a. The first outer isolation regions 452a may have substantially uniform widths.

The second isolation regions 450b include second inner isolation regions 454b and second outer isolation regions 452b. The second inner isolation regions 454b are provided in the chip regions 420. The second outer isolation regions 452b are provided at both ends of the second inner isolation regions 454b so as to extend toward the scribe region 410. The second outer isolation regions 452b may have the same width as the second inner isolation regions 454b.

The adjacent first outer isolation regions 452a or the second outer isolation regions 454a can be spaced apart from each other and the separation may be narrower than the width of the scribed region 310. Accordingly, the PCB 400 may be easily processed. Ball lands 405 are formed on the chip region 420. Bond fingers 418 are formed adjacent to the first inner isolation regions 454a.

Figure 22:
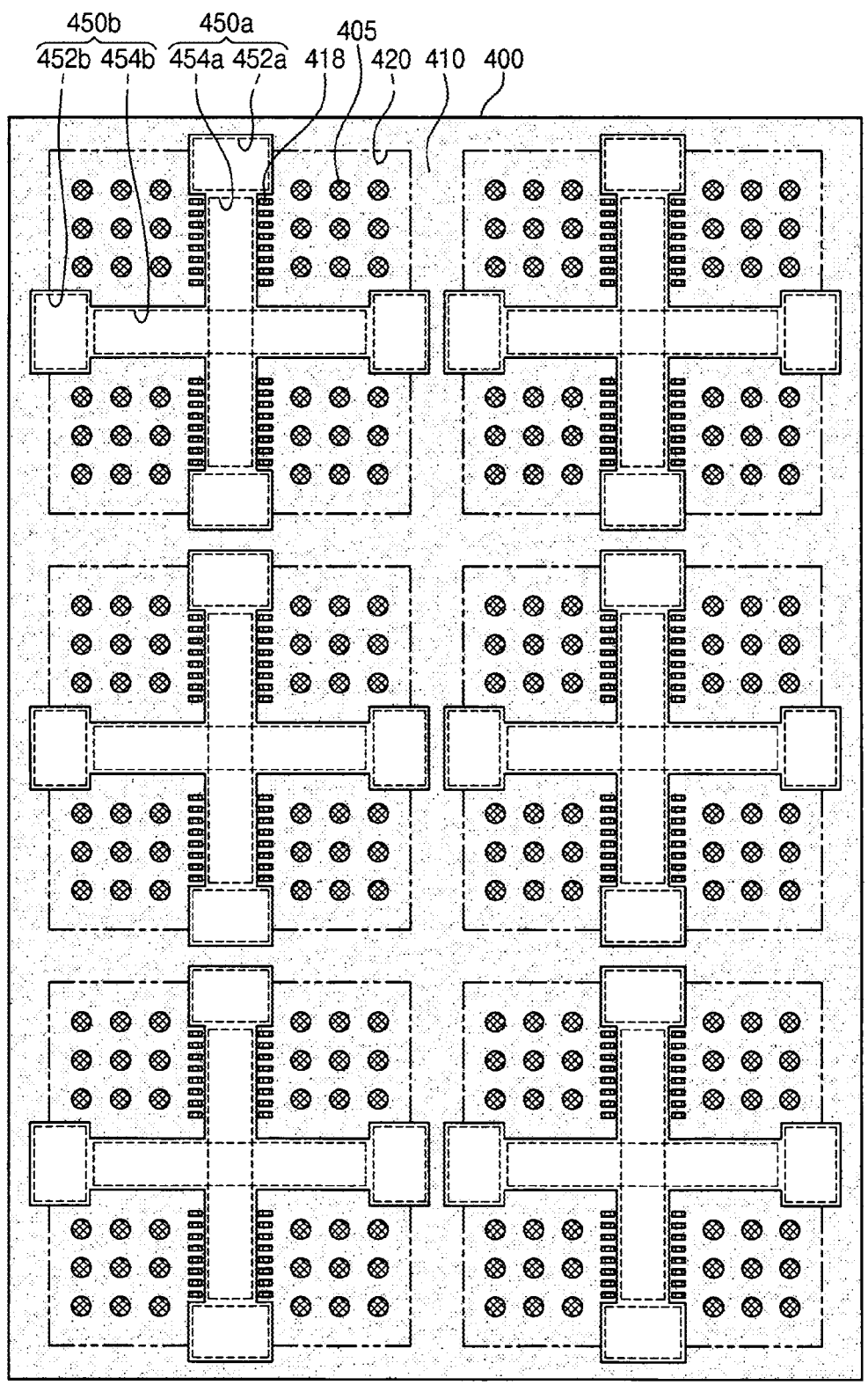

Referring to FIG. 22, the widths of the first inner isolation regions 454a may be wider than the widths of the first outer isolation regions 452a. In more detail, the second outer isolation regions 454b may have substantially uniform widths. Because the first and second outer isolation regions 454a and 454b have wide widths, a pressure of EMC may be drastically reduced, and supply of EMC may be facilitated.

Figure 23:
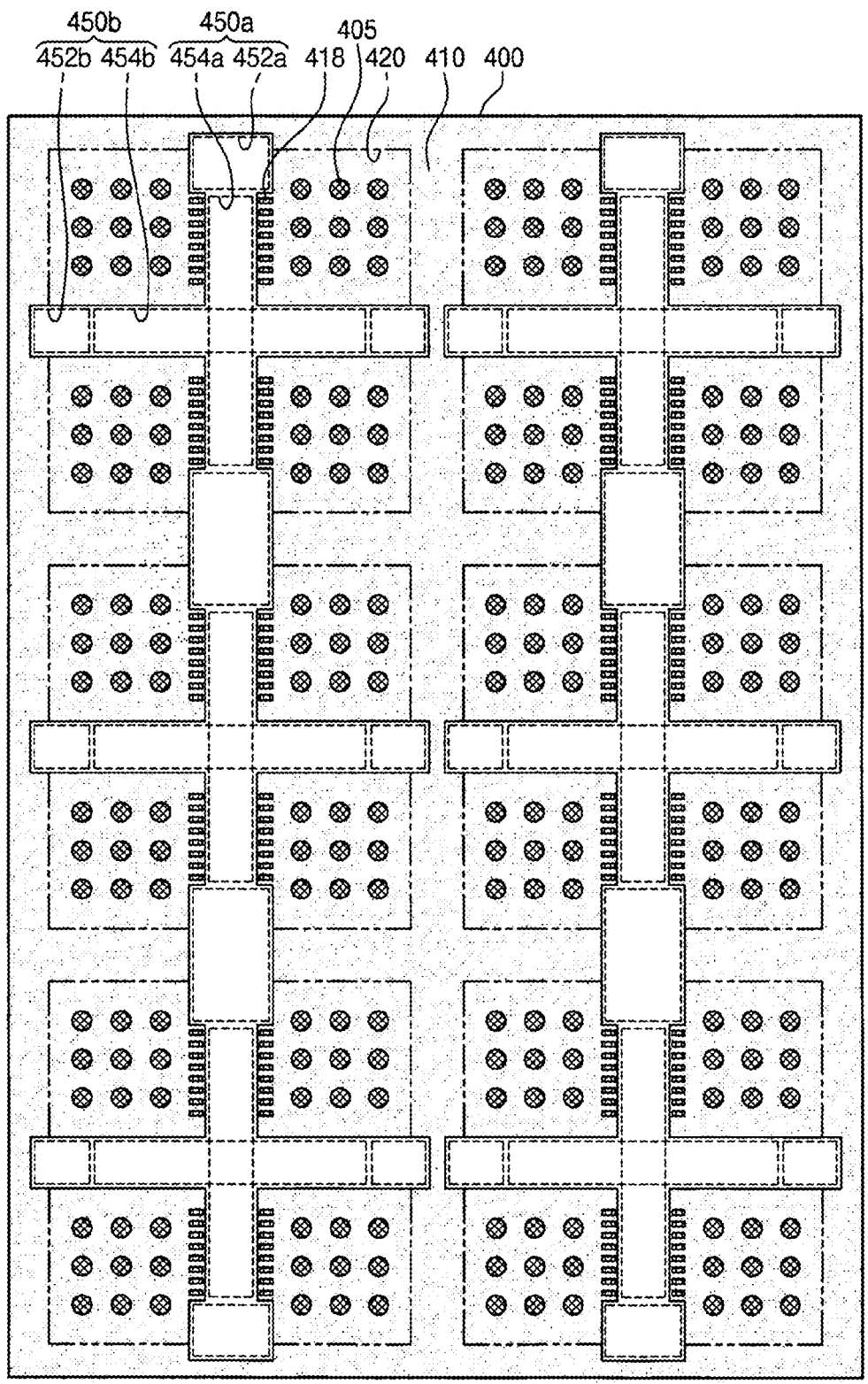

Referring to FIG. 23, the widths of the first outer isolation regions 452a may be wider than the widths of the first inner isolation regions 454a. In more detail, the first outer isolation regions 452a may have substantially uniform widths. The first outer isolation regions 452a may be connected to each other at the scribe region 410. Accordingly, the forming of the first isolation regions 450a may be done more easily.

Figure 24:
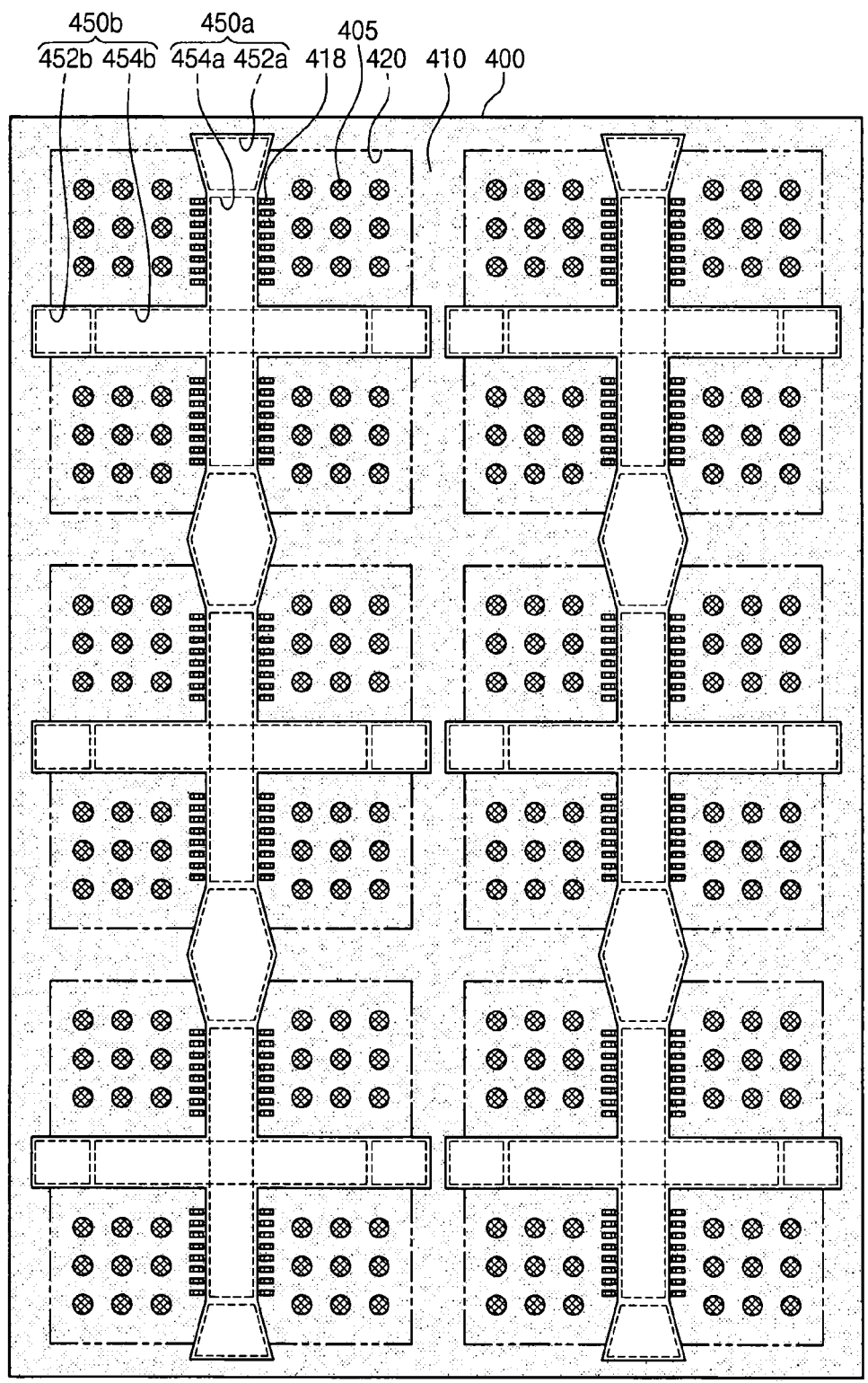

Referring to FIG. 24, the widths of the first outer isolation regions 452a may be wider than the widths of the first inner isolation regions 454a. In more detail, the widths of the first outer isolation regions 452a may be tapered from the scribe region 410 to the first inner isolation regions 454a. The first outer isolation regions 452a may be connected to each other at the scribe region 410. The second outer isolation regions 452b may have the same width as the second inner isolation regions 454b.

Figure 25:
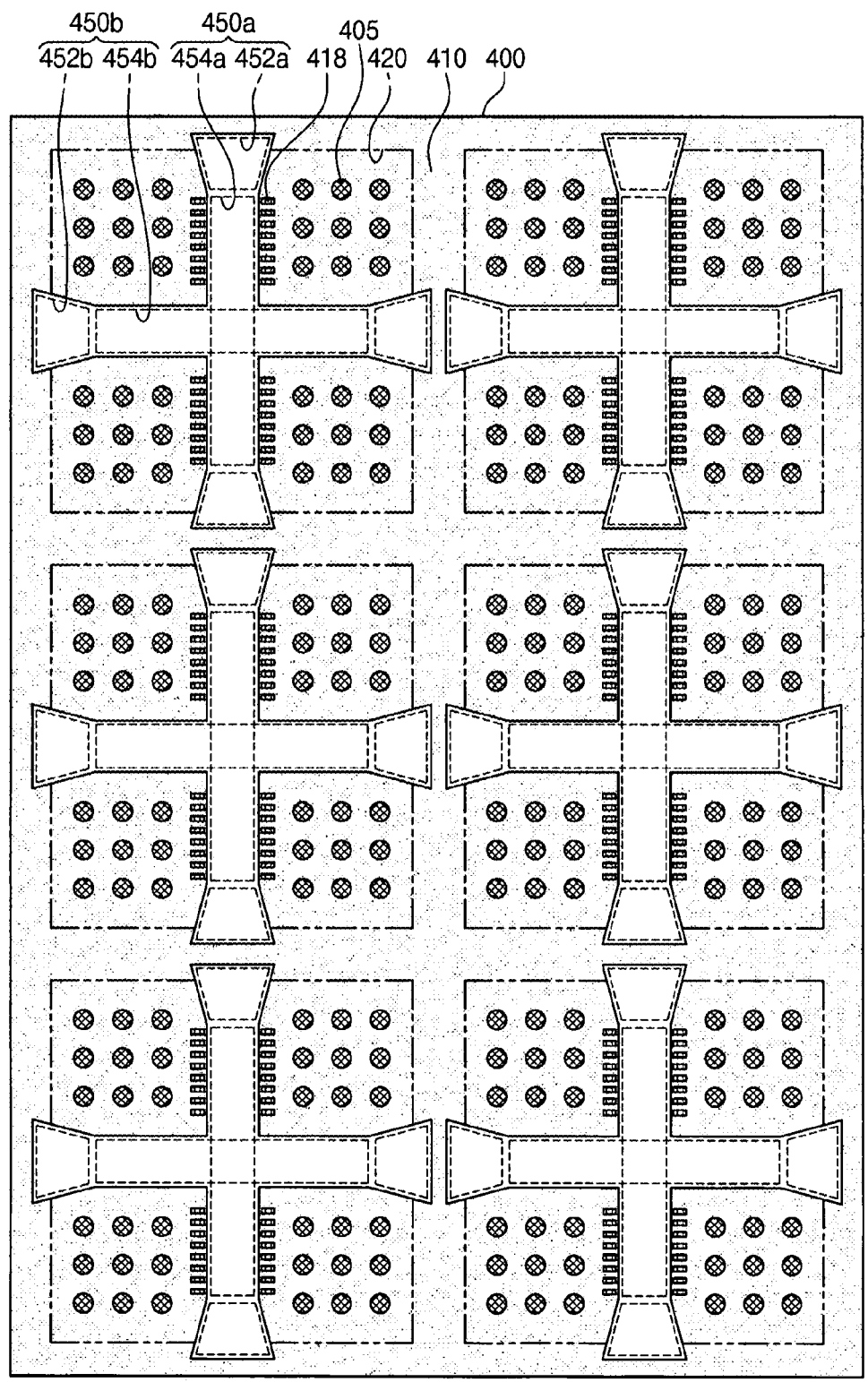

Referring to FIG. 25, the widths of the first and second outer isolation regions 452a and 452b may be wider than the widths of the first and second inner isolation regions 454a and 454b. In more detail, the widths of the first and second outer isolation regions 452a and 452b may be tapered from the scribe region 410 to the first and second inner isolation regions 454a and 454b. The first outer isolation regions 452a and the second outer isolation region s452b are spaced apart from each other, and the separation may be narrower than the width of the scribe region 410.

Because the first and second outer isolation regions 452a and 452b are sufficiently broad, a pressure of EMC may be reduced, and supply of EMC may be facilitated. Accordingly, the semiconductor chip and the lower molding layer according to some embodiments of the present invention may not be delaminated and also sweeping and shorts of the wires can be prevented. Additionally, the wires may be formed adjacent to the first outer isolation region 452a.

After forming the isolation region, the mounting of the semiconductor chip in operation S120, the molding of EMC in operation S130, and the cutting of the PCB in operation S140 proceed. The semiconductor package described with FIGS. 8 through 11 is completed in operation S150.

Figure 26:
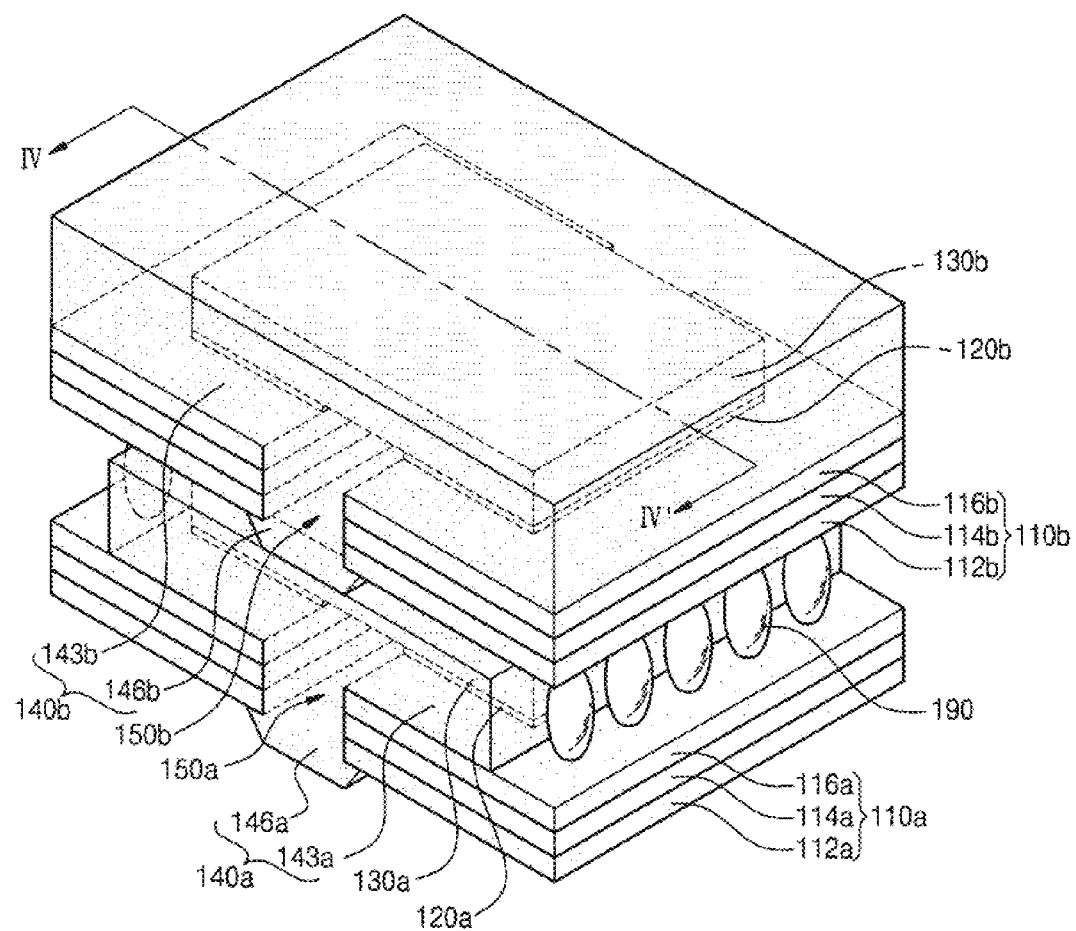
FIGS. 26 through 31 are views illustrating a semiconductor package according to a modified embodiment of the present invention.
Figure 27:
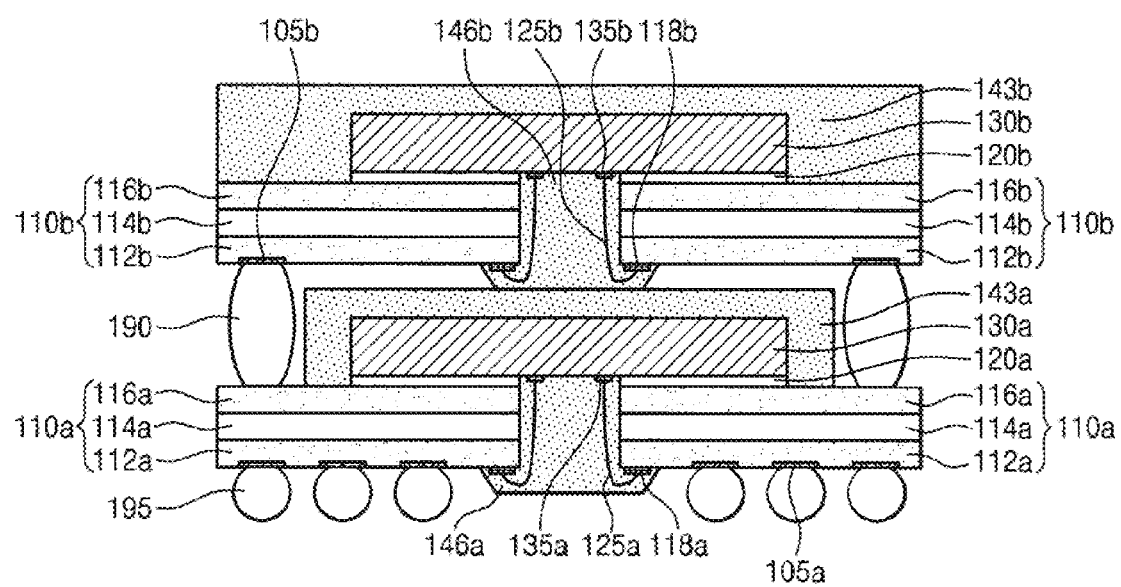
Figure 28:
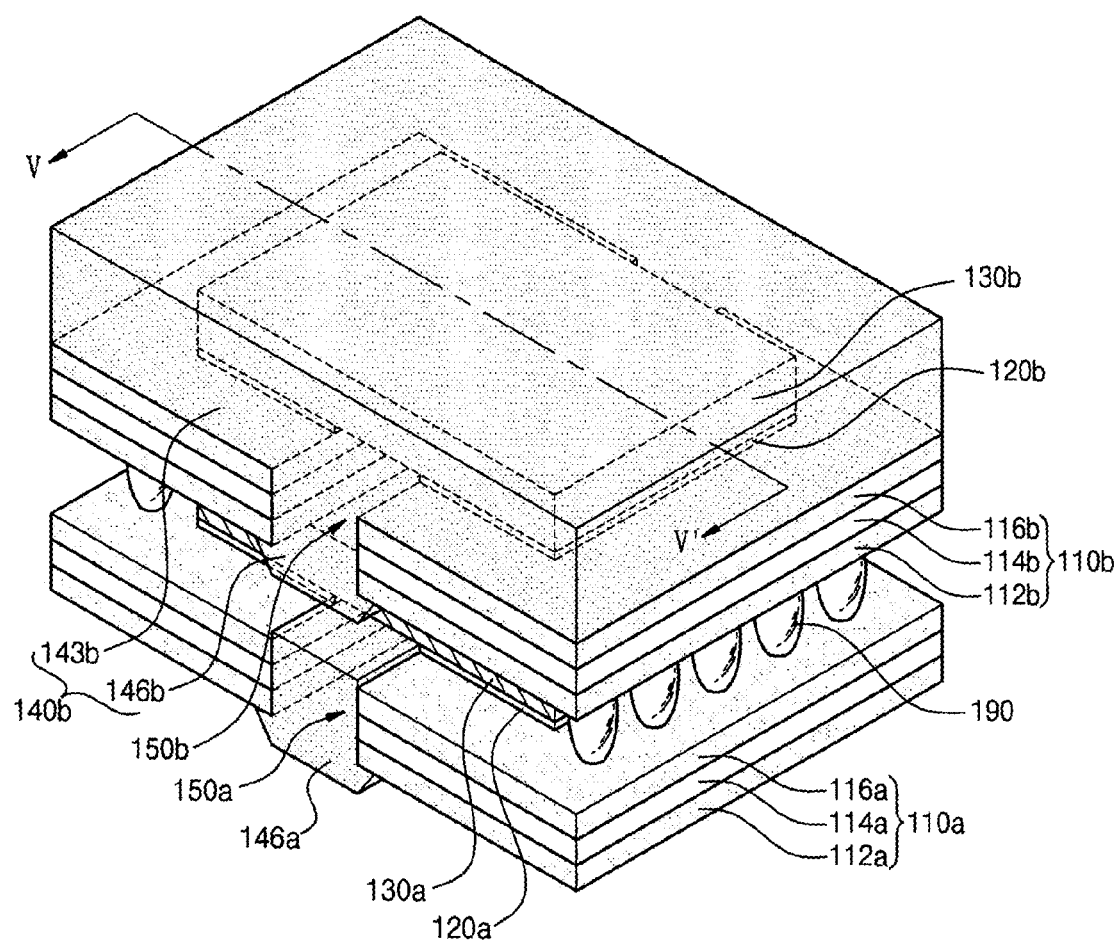
Figure 29:
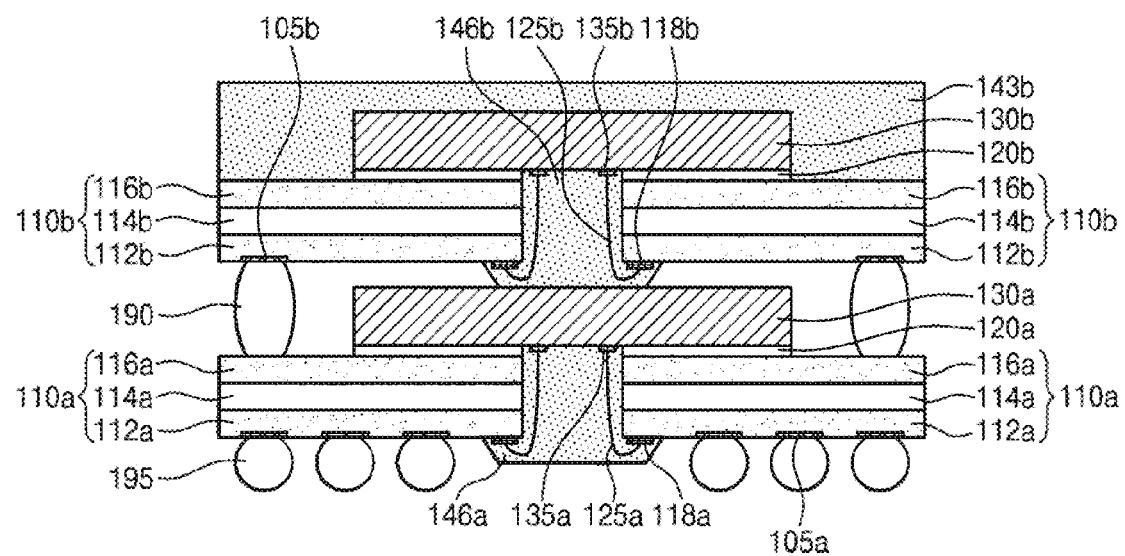
Figure 30:
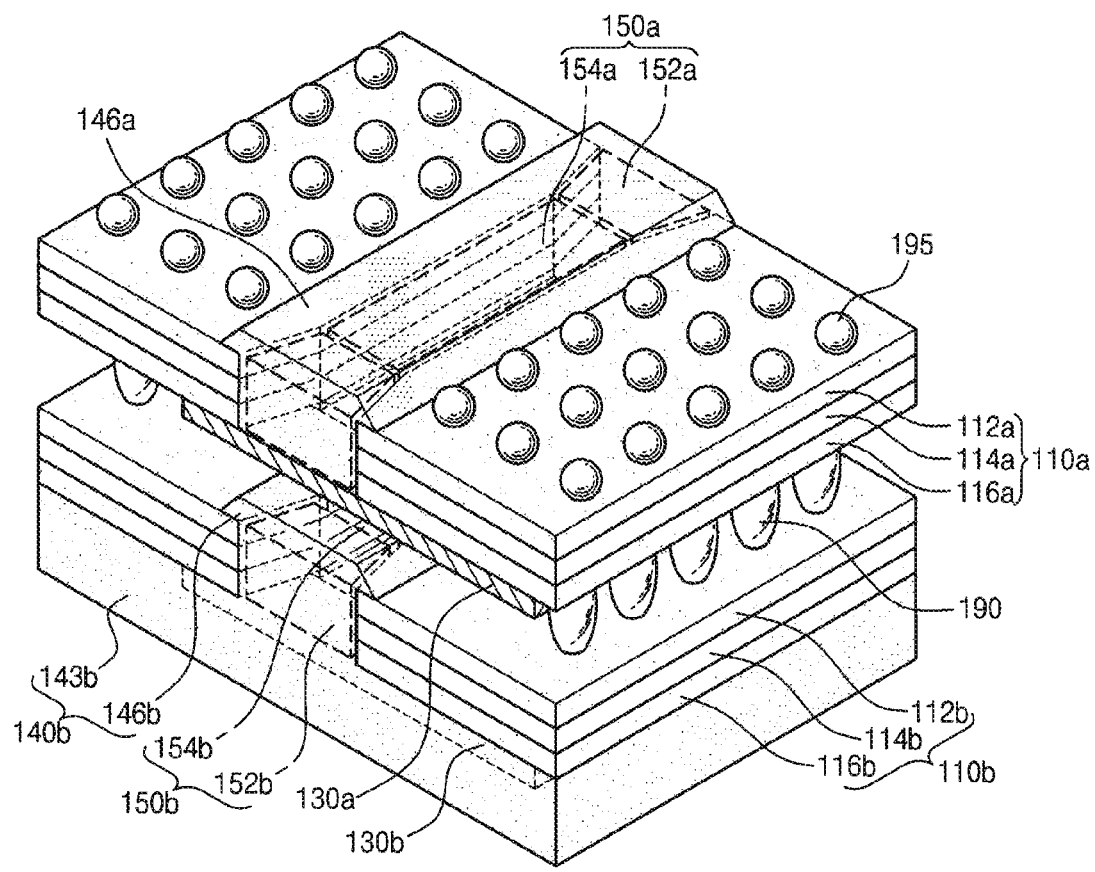
Figure 31:
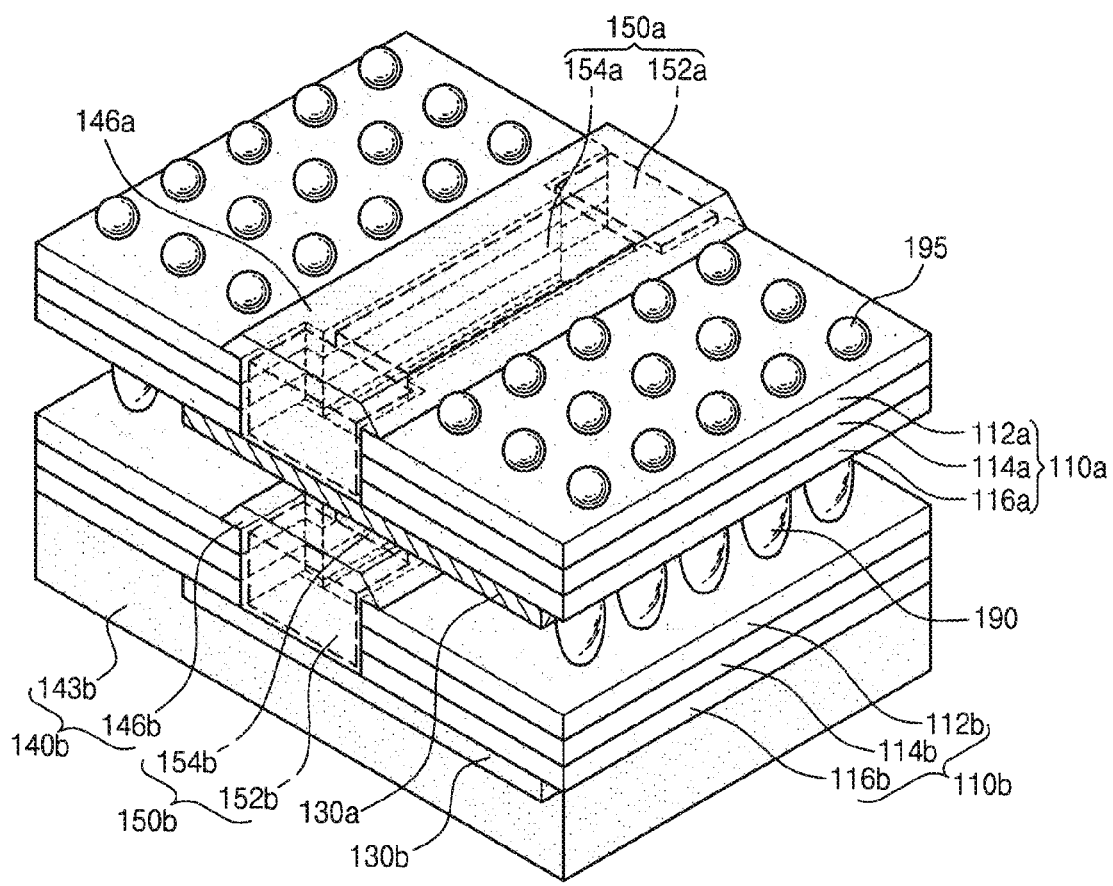

FIGS. 26 through 31 are views illustrating a semiconductor package according to a modified embodiment of the present invention. FIG. 27 is a sectional view taken along a line of IV-IV' of FIG. 26. FIG. 29 is a sectional view taken along a line V-V' of FIG. 28. FIGS. 30 and 31 are perspective views of a semiconductor package.

Referring to FIGS. 26 and 27, there is provided a first PCB 110a divided into two parts by the first isolation region 150a. The first PCB 110a may include a lower insulation layer 112a, a core material layer 114a, and an upper insulation layer 116a. A first semiconductor chip 130a is mounted on the first PCB 110a by a first adhesive layer 120a. A second PCB 110b is disposed on the first semiconductor chip 130a. The second PCB 110b is divided into two parts by the second isolation region 150b. The first and second isolation regions 150a and 150b may have substantially uniform widths. The second PCB 110b includes a lower insulation layer 112b, a core material layer 114b, and an upper insulation layer 116b. A second semiconductor chip 130b is mounted on the second PCB 110b by a second adhesive layer 120b.

Upper solder balls 190 are disposed to electrically connect the first PCB 110a with the second PCB 110b. Lower solder balls 195 are disposed on the bottom surface of the first PCB 110a. The lower solder balls 195 may be electrically connected to the external circuit. The first and second semiconductor chips 130a and 130b may have first and second bonding pads 135a and 135b, which are respectively disposed on their centers. The bottom surfaces of the first PCB 110a and the second PCB 110b may have the respective bond fingers 118a and 118b. Wires 125a and 125b are provided to connect the bonding pads 135a and 135b with the bonding fingers 118a and 118b, respectively.

A first molding layer is disposed on the first isolation region 150a, and a second molding layer is disposed on the second isolation region 150b. The first molding layer includes a first upper molding layer 143a and a first lower molding layer 146a. The first upper molding layer 143a covers the first semiconductor chip 130a. The first lower molding layer 146a extends from the first isolation region 150a to cover a portion of the bottom surface of the first PCB 110a. The second molding layer includes a second upper molding layer 143b and a second lower molding layer 146b. The second upper molding layer 143b covers the second semiconductor chip 130b. The second lower molding layer 146b extends from the second isolation region 150b to cover a portion of the bottom surface of the second PCB 110b. The first upper molding layer 143a may contact the second lower molding layer 146b. According to the embodiments of the present invention, because the PCB is separated, a molding layer of a stack semiconductor package can be formed to be thin. Therefore, reliability of a semiconductor package can be improved.

Referring to FIGS. 28 and 29, unlike the first molding layer of FIGS. 26 and 27, the first upper molding layer 143a is not provided. Accordingly, the second lower molding layer 146b may contact the first semiconductor chip 130a. Because the first upper molding layer 143a is not provided, the thickness of a stack semiconductor package may be reduced.

Referring to FIGS. 30 and 31, the first isolation region 150a may include a first inner isolation region 154a and two first outer isolation regions 152a at both ends of the first inner isolation region 154a. The second isolation region 150b may include a second inner isolation region 154b and two second outer isolation regions 152b at both ends of the second inner isolation region 154b. At least one width of the first outer isolation regions 152a may be wider than the width of the first inner isolation region 154a. At least one width of the second outer isolation regions 152b may be wider than the width of the second inner isolation region 154b.

The widths of the first outer isolation regions 152a may be tapered from the edge of the first PCB 110a toward the first inner isolation region 154a. The widths of the second outer isolation regions 152b may be tapered from the edge of the second PCB 110b toward the second inner isolation region 154b. Additionally, the first outer isolation regions 152a may have substantially uniform width, and also the second outer isolation regions 152b may have substantially uniform width. Because the first and second outer isolation regions 152a and 152b are provided, reliability of a semiconductor package is improved and the thickness of the molding layer may be thinner.

Figure 32:
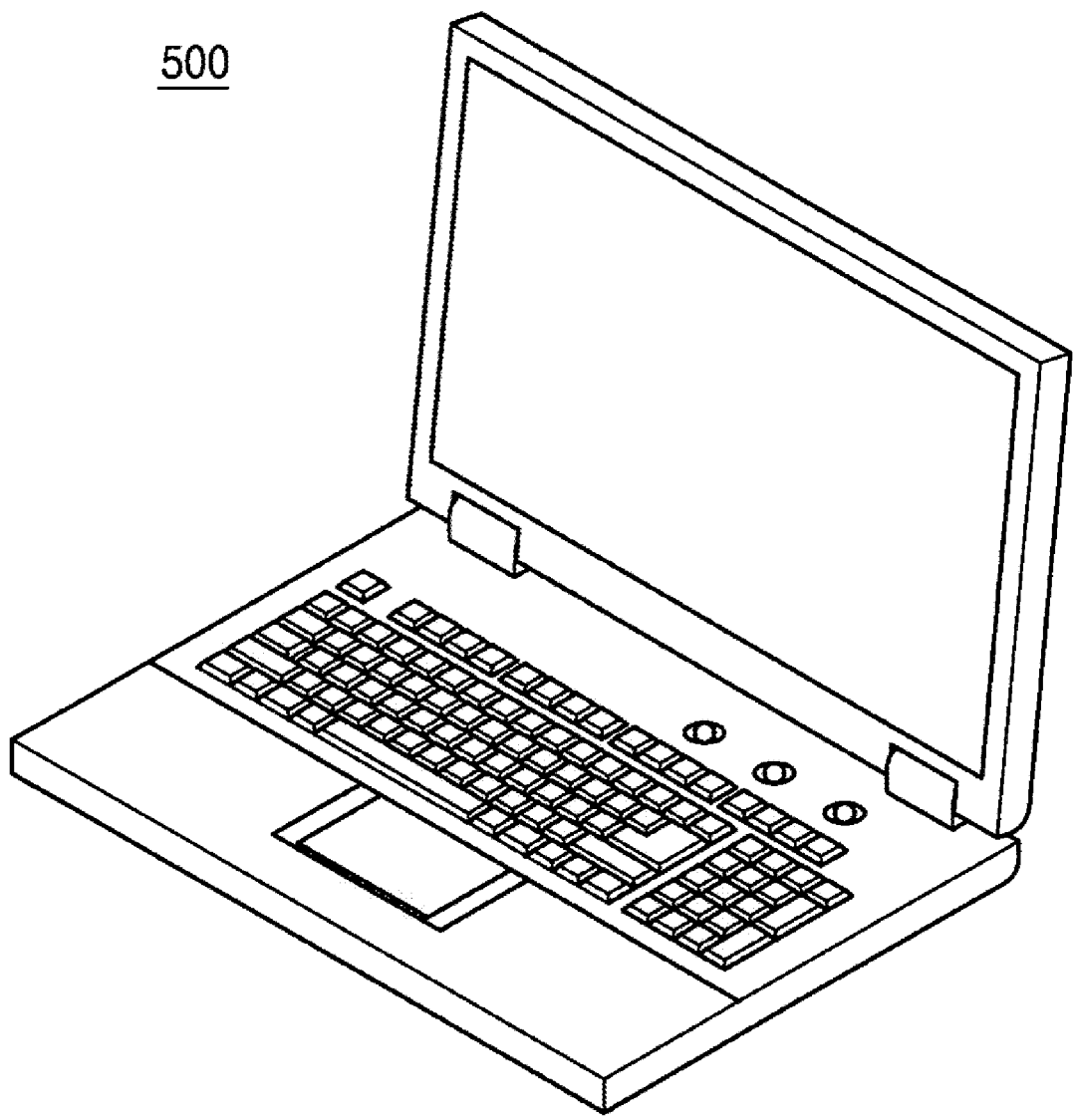
FIGS. 32 and 33 are views of an electronic device including a semiconductor package according to embodiments of the present invention.
Figure 33:
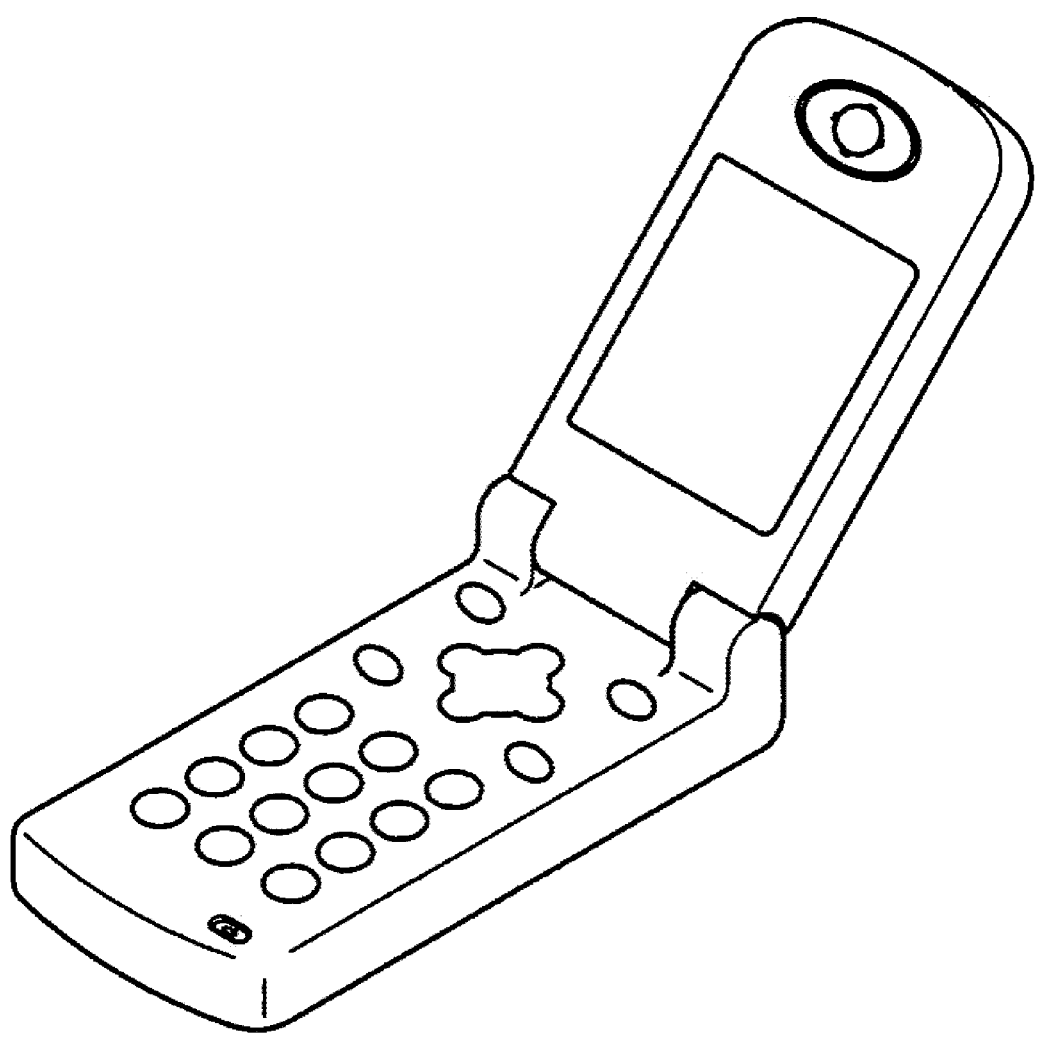

FIGS. 32 and 33 are views of an electronic device including a semiconductor package according to embodiments of the present invention. The electronic device includes a semiconductor package according to the embodiments of the present invention. The electronic device may be a notebook 500 or a mobile phone 600. Also, the electronic device may include game consoles, camcorders, etc.

According to the embodiments of the present invention, because outer isolation regions are provided, a sufficient contacting area between the upper molding layer and the lower molding layer can be obtained. Consequently, the semiconductor chip and the lower molding layer are not delaminated. Because a pressure of EMC is decreased, sweeping and shorts of the wires can be prevented. Accordingly, reliability of the semiconductor package can be improved.

Furthermore, because the wires may be disposed at the edge of the inner isolation region, the area in which the bonding pads are disposed can be reduced. Accordingly, a demand for miniaturization of the semiconductor package can be satisfied.

Embodiments of the present invention provide semiconductor packages including: a PCB having at least two parts divided by an isolation region; a semiconductor chip mounted on the PCB; and a molding layer disposed in the isolation region.

According to some embodiments, the isolation region includes an inner isolation region and two outer isolation regions, the two outer isolation regions being provided at both ends of the inner isolation region, and at least one width of the outer isolation regions is wider than a width of the inner isolation region.

In other embodiments, at least one width of the outer isolation regions is tapered from an edge of the PCB toward the inner isolation region.

In still other embodiments, at least one width of the outer isolation regions is substantially uniform.

In even other embodiments, the inner isolation region includes a wider width at its center spaced apart from the outer isolation regions than its edge contacting the outer isolation regions.

In yet other embodiments, the isolation region includes a first isolation region crossing over the PCB in one direction, the PCB being divided into two parts by the first isolation region.

In further embodiments, the first isolation region includes a first inner isolation region and two first outer isolation regions, the two first outer isolation being provided at both ends of the first inner isolation region, and at least one width of the first outer isolation regions is wider than a width of the first inner isolation region.

In still further embodiments, the isolation region further includes a second isolation region intersecting the first isolation region, and the PCB is divided into four parts by the first isolation region and the second isolation region.

In even further embodiments, the second isolation region includes a second inner isolation region and second outer isolation regions, the second outer isolation region being provided at both ends of the second inner isolation region, and at least one width of the second outer isolation regions is wider than a width of the second inner isolation region.

In yet further embodiments, the semiconductor chip includes bonding pads at its center, the PCB includes bond fingers adjacent to the isolation region, and further comprising wires that electrically connect the bonding pads with the bond fingers.

In still further embodiments, the molding layer includes: a lower molding layer extending from the isolation region to cover the bond fingers and the wires; and an upper molding layer covering the semiconductor chip, wherein the upper molding layer and the lower molding layer contact each other at the outer isolation regions.

In yet further embodiments, a width of the lower molding layer is wider than widths of the outer isolation regions.

In other embodiments of the present invention, semiconductor packages include: a PCB including at least two parts divided by an isolation region; a semiconductor chip mounted on the PCB; and a molding layer disposed in the isolation region, wherein the isolation region includes an inner isolation region and two outer isolation regions, the two outer isolation regions being provided at both ends of the inner isolation region and facilitating supply of the molding layer.

In some embodiments, at least one width of the outer isolation regions is wider than a width of the inner isolation region.

In other embodiments, the molding layer includes: a lower molding layer extending from the isolation region to cover a portion of a bottom surface of the PCB; and an upper molding layer covering a top surface of the PCB and the semiconductor chip, wherein the upper molding layer and the lower molding layer contact each other at the outer isolation regions.

In still other embodiments of the present invention, semiconductor packages include: PCBs including at least two parts divided by an isolation region; a semiconductor chip mounted on each of the PCBs; and a molding layer disposed in the isolation region, wherein at least one of the PCBs includes a polygon that has at least five sides.

In some embodiments, one of the sides of the polygon facilitates supply of the molding layer.

In even other embodiments of the present invention, PCBs include: a plurality of chip regions including at least two parts divided by isolation regions; and a scribe region surrounding each of the chip regions, wherein the isolation regions are provided in the chip regions so as to extend toward the scribe region.

In some embodiments, the isolation regions include inner isolation regions and outer isolation regions, the inner isolation regions being provided in the chip regions, the outer isolation regions being provided at both ends of the inner isolation regions so as to extend toward the scribe region, wherein at least one width of the outer isolation regions is wider than widths of the inner isolation regions.

In other embodiments, at least one width of the outer isolation regions is tapered from the scribe region toward the inner isolation region.

In still other embodiments, at least one width of the outer isolation regions is substantially uniform.

In even other embodiments, the outer isolation regions are connected to each other at the scribe region.

In yet other embodiments, the adjacent outer isolation regions are spaced apart from each other and a separation between the adjacent outer isolation regions is narrower than a width of the scribe region.

In yet other embodiments of the present invention, methods of forming a semiconductor package include: preparing a PCB, the PCB including a plurality of chip regions and a scribe region; forming isolation regions dividing each of the chip regions into two parts, the isolation regions including inner isolation regions and outer isolation regions, the inner isolation regions being provided in the chip regions, the outer isolation regions being provided at both ends of the inner isolation regions to extend toward the scribe region; mounting semiconductor chips on the chip regions; and cutting the PCB along the scribe region to divide the chip regions into at least two parts.

In some embodiments, at least one width of the outer isolation regions is wider than widths of the inner isolation regions.

In other embodiments, at least one width of the outer isolation regions is tapered from the scribe region toward the inner isolation regions.

In still other embodiments, at least one width of the outer isolation regions is substantially uniform.

In even other embodiments, the inner isolation region includes a wider width at its center spaced apart from the outer isolation regions than its edge contacting the outer isolation regions.

In yet other embodiments, the outer isolation regions are connected to each other at the scribe region.

In further embodiments, the adjacent outer isolation regions are spaced apart from each other and a separation between the adjacent outer isolation regions is narrower than a width of the scribe region.

In still further embodiments, the forming of the isolation regions includes forming first isolation regions that cross over the chip regions in one direction, each of the chip regions being divided into two parts by the first isolation region.

In even further embodiments, the forming of the first isolation regions includes: forming first inner isolation regions in the chip regions; and forming first outer isolation regions being provided at both ends of the first inner isolation regions to extend toward the scribe region, wherein at least one width of the first outer isolation regions is wider than widths of the first inner isolation regions.

In yet further embodiments, the forming of the isolation regions further includes forming second isolation regions that intersect the first isolation regions, and each of the chip regions are divided into four parts by the first and second isolation regions.

In yet further embodiments, the forming of the second isolation regions includes: forming second inner isolation regions in the chip regions; and forming second outer isolation regions provided at both ends of the second inner isolation regions so as to extend toward the scribe region, wherein at least one width of the second outer isolation regions is wider than widths of the second inner isolation regions.

In still further embodiments, the PCB includes bond fingers adjacent to the isolation regions and the semiconductor chips include bonding pads at their centers, and further comprising forming wires that electrically connect the bond fingers with the bonding pads.

In yet further embodiments, the methods further include forming a molding layer in the isolation regions, the molding layer including an upper molding layer and a lower molding layer, the upper molding layer covering the semiconductor chips, the lower molding layer covering the wires.

In further embodiments of the present invention, semiconductor packages include: a first PCB including at least two parts divided by a first isolation region; a first semiconductor chip mounted on the first PCB; a first molding layer disposed on the first isolation region; a second PCB disposed on or below the first semiconductor chip; and a second semiconductor chip mounted on the second PCB.

In some embodiments, the second PCB is divided into at least two parts by a second isolation region, and further comprising a second molding layer disposed in the second isolation region.

In other embodiments, each of the first and second isolation regions has a substantially uniform width.

In still other embodiments, the first isolation region includes a first inner isolation region and two first outer isolation regions, the two first outer isolation regions being provided at both ends of the first inner isolation region, the second isolation region includes a second inner isolation region and two second outer isolation regions, the two second outer isolation regions being provided at both ends of the second inner isolation region, at least one width of the first outer isolation regions is wider than a width of the first inner isolation region, and at least one width of the second outer isolation regions is wider than a width of the second inner isolation region.

In even other embodiments, widths of the first outer isolation regions are tapered from an edge of the first PCB toward the first inner isolation region.

In yet other embodiments, widths of the second outer isolation regions are tapered from an edge of the second PCB toward the second inner isolation region.

In further embodiments, the first outer isolation regions have substantially uniform widths.

In still further embodiments, the second outer isolation regions have substantially uniform widths.

In even further embodiments, the semiconductor packages further include a solder ball that electrically connects the first PCB with the second PCB.

In yet further embodiments, the first molding layer includes a first upper molding layer and a first lower molding layer, the first upper molding layer covering the first semiconductor chip, the first lower molding layer extending from the first isolation region to cover a portion of a bottom surface of the first PCB, the second molding layer includes a second upper molding layer and a second lower molding layer, the second upper molding layer covering the second semiconductor chip, the second lower molding layer extending from the second isolation region to cover a portion of a bottom surface of the second PCB, and the first upper molding layer contacts the second lower molding layer.

In still further embodiments of the present invention, the first molding layer includes a first upper molding layer and a first lower molding layer, the first upper molding layer covering the first semiconductor chip, the lower molding layer extending from the first isolation region to cover a portion of a bottom surface of the first PCB, the second molding layer extends from the second isolation region to cover a portion of a bottom surface of the second PCB, and the second lower molding layer contacts the first semiconductor chip.

In even further embodiments of the present invention, electronic devices include the above first semiconductor package.

In yet further embodiments of the present invention, electronic devices include the above second semiconductor package.

In still further embodiments of the present invention, electronic devices include the semiconductor package formed by the above first method.

In yet further embodiments of the present invention, electronic devices include the semiconductor package formed by the above second method.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package comprising:
   a printed circuit board (PCB) including at least two parts divided by an isolation region;
   a semiconductor chip mounted on the PCB; and
   a molding layer disposed in the isolation region,
   wherein the isolation region comprises a first isolation region crossing over the PCB in one direction, the PCB being divided into two parts by the first isolation region.

2. The semiconductor package of claim 1, wherein the isolation region comprises an inner isolation region and two outer isolation regions, the two outer isolation regions disposed at both ends of the inner isolation region, and
   at least one width of the outer isolation regions is wider than a width of the inner isolation region.

3. The semiconductor package of claim 2, wherein at least one width of the outer isolation regions is tapered from an edge of the PCB to the inner isolation region.

4. The semiconductor package of claim 2, wherein at least one width of the outer isolation regions is substantially uniform.

5. The semiconductor package of claim 4, wherein the inner isolation region comprises a wider width at its center, spaced apart from the outer isolation regions, than its edge, contacting the outer isolation regions.

6. The semiconductor package of claim 1, wherein the first isolation region comprises a first inner isolation region and two first outer isolation regions, the two first outer isolation disposed at both ends of the first inner isolation region, and
   at least one width of the first outer isolation regions is wider than a width of the first inner isolation region.

7. The semiconductor package of claim 1, wherein the isolation region further comprises a second isolation region intersecting the first isolation region, and the PCB is divided into four parts by the first isolation region and the second isolation region.

8. The semiconductor package of claim 7, wherein the second isolation region comprises a second inner isolation region and second outer isolation regions, the second outer isolation region disposed at both ends of the second inner isolation region, and
   at least one width of the second outer isolation regions is wider than a width of the second inner isolation region.

9. The semiconductor package of claim 2, wherein the semiconductor chip comprises bonding pads at its center, the PCB comprises bond fingers adjacent to the isolation region, and further comprising wires that electrically connect the bonding pads with the bond fingers.

10. The semiconductor package of claim 9, wherein the molding layer comprises:
    a lower molding layer extending from the isolation region to cover the bond fingers and the wires; and
    an upper molding layer covering the semiconductor chip,
    wherein the upper molding layer and the lower molding layer contact each other at the outer isolation regions.

11. The semiconductor package of claim 10, wherein a width of the lower molding layer is wider than widths of the outer isolation regions.

12. A semiconductor package comprising:
    a PCB including at least two parts divided by an isolation region, the isolation region including an opening penetrating the PCB;
    a semiconductor chip mounted on the PCB; and
    a molding layer disposed in the opening of the isolation region,
    wherein the isolation region comprises an inner isolation region and two outer isolation regions, the two outer isolation regions disposed at both ends of the inner isolation region,
    wherein the molding layer comprises:
      a lower molding layer extending from the isolation region so as to cover a portion of a bottom surface of the PCB; and
      an upper molding layer covering a top surface of the PCB and the semiconductor chip, and
    wherein the upper molding layer and the lower molding layer contact each other through the opening penetrating the PCB.

13. The semiconductor package of claim 12, wherein at least one width of the outer isolation regions is wider than a width of the inner isolation region.

14. The semiconductor package of claim 12, wherein the PCB comprises a polygon that has at least five sides.

* * * * *